(12) United States Patent
Couillard et al.

(10) Patent No.: US 7,399,681 B2
(45) Date of Patent: *Jul. 15, 2008

(54) GLASS-BASED SOI STRUCTURES

(75) Inventors: James Gregory Couillard, Ithaca, NY (US); Kishor Purushottam Gadkaree, Big Flats, NY (US); Joseph Frank Mach, Lindley, NY (US)

(73) Assignee: Corning Incorporated, Corning, NY (US)

( * ) Notice: Subject to any disclaimer, the term of this patent is extended or adjusted under 35 U.S.C. 154(b) by 365 days.

This patent is subject to a terminal disclaimer.

(21) Appl. No.: 11/150,392

(22) Filed: Jun. 10, 2005

(65) Prior Publication Data

US 2005/0255670 A1 Nov. 17, 2005

Related U.S. Application Data

(63) Continuation-in-part of application No. 10/779,582, filed on Feb. 12, 2004, now Pat. No. 7,176,528.

(60) Provisional application No. 60/448,176, filed on Feb. 18, 2003.

(51) Int. Cl.
H01L 21/46 (2006.01)

(52) U.S. Cl. .................. 438/458; 257/E21.48; 438/455

(58) Field of Classification Search ............ 257/E21.48; 438/455, 458

See application file for complete search history.

(56) References Cited

U.S. PATENT DOCUMENTS

| | | | | |
|---|---|---|---|---|
| 4,294,602 A | 10/1981 | Horne | ............................ | 65/40 |
| 4,737,756 A * | 4/1988 | Bowman | ........................ | 338/4 |
| 5,374,564 A | 12/1994 | Bruel | .......................... | 437/24 |
| 5,442,205 A | 8/1995 | Brasen et al. | ................ | 257/191 |
| 5,559,043 A | 9/1996 | Bruel | .......................... | 437/24 |
| 5,854,123 A | 12/1998 | Sato et al. | .................... | 438/507 |
| 5,909,627 A | 6/1999 | Egloff | ......................... | 438/406 |
| 6,010,579 A * | 1/2000 | Henley et al. | .............. | 148/33.2 |
| 6,048,411 A | 4/2000 | Henley et al. | .............. | 148/33.5 |
| 6,107,653 A | 8/2000 | Fitzgerald | .................... | 257/191 |
| 6,140,209 A | 10/2000 | Iwane et al. | ................. | 438/458 |
| 6,150,239 A | 11/2000 | Goesele et al. | .............. | 438/458 |
| 6,211,041 B1 | 4/2001 | Ogura | ......................... | 438/458 |

(Continued)

FOREIGN PATENT DOCUMENTS

EP 0539741 5/1993 .................... 93/18

(Continued)

OTHER PUBLICATIONS

M. Bruel; "Silicon on insulator material technology"; Electronics Letters; Jul. 1995; vol. 13, No. 14; pp. 1201-1202.

(Continued)

*Primary Examiner*—Asok K Sarkar
(74) *Attorney, Agent, or Firm*—Timothy M. Schaeberle

(57) ABSTRACT

A method of forming a semiconductor on glass structure includes: establishing an exfoliation layer on a semiconductor wafer; contacting the exfoliation layer of the semiconductor wafer to a glass substrate; applying pressure, temperature and voltage to the semiconductor wafer and the glass substrate, without a vacuum atmosphere, such that a bond is established therebetween via electrolysis; and applying stress such that the exfoliation layer separates from the semiconductor wafer and remains bonded to the glass substrate.

18 Claims, 19 Drawing Sheets

U.S. PATENT DOCUMENTS

| | | | |
|---|---|---|---|
| 6,251,754 B1 | 6/2001 | Ohshima et al. | 438/506 |
| 6,309,950 B1 | 10/2001 | Forbes | 438/455 |
| 6,319,867 B1 | 11/2001 | Chacon et al. | 501/66 |
| 6,323,108 B1 | 11/2001 | Kub et al. | 438/458 |
| 6,335,231 B1 | 1/2002 | Yamazaki et al. | 438/151 |
| 6,391,740 B1 | 5/2002 | Cheung et al. | 438/455 |
| 6,573,126 B2 | 6/2003 | Cheng et al. | 438/149 |
| 6,593,641 B1 | 7/2003 | Fitzergald | 257/616 |
| 6,610,582 B1 * | 8/2003 | Stewart | 438/455 |

FOREIGN PATENT DOCUMENTS

| | | | |
|---|---|---|---|
| EP | 0557588 | 9/1993 | 93/35 |

OTHER PUBLICATIONS

Cioccio et al.; "Silicon carbide on insulator formation using the Smart Cut process"; Electronics Letters; Jun. 1996; vol. 32, No. 12; pp. 1144-1145.

Marshall et al; "Measurement of adherence of residually stressed thin films by indentation. I. Mechanics of interface delamination"; J. Appl. Phys; Nov. 1984; vol. 56, No. 10; pp. 2632-2638.

Bister et al; "Ranges of the 0.3-2 MeV $H^+$ and 0.7-2 MeV $H^+_2$ ions in Si and Ge"; Radiation Effects; 1982; vol. 59; pp. 199-202.

Lee, et al: "Semiconductor layer transfer by anodic wafer bonding"; IEEE International SOI Conference; Oct. 1997; pp. 40-41.

Spangler, et al.; "A technology for high-performance single-crystal silicon-on-insulator transistors"; IEEE Electron Device Letters; vol. 8, No. 4; Apr. 1987; pp. 137-139.

* cited by examiner

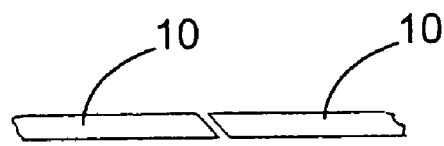
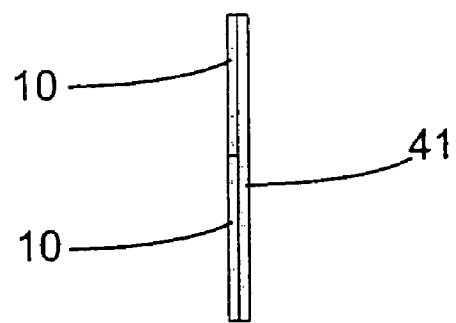
FIG. 13A          FIG. 13B
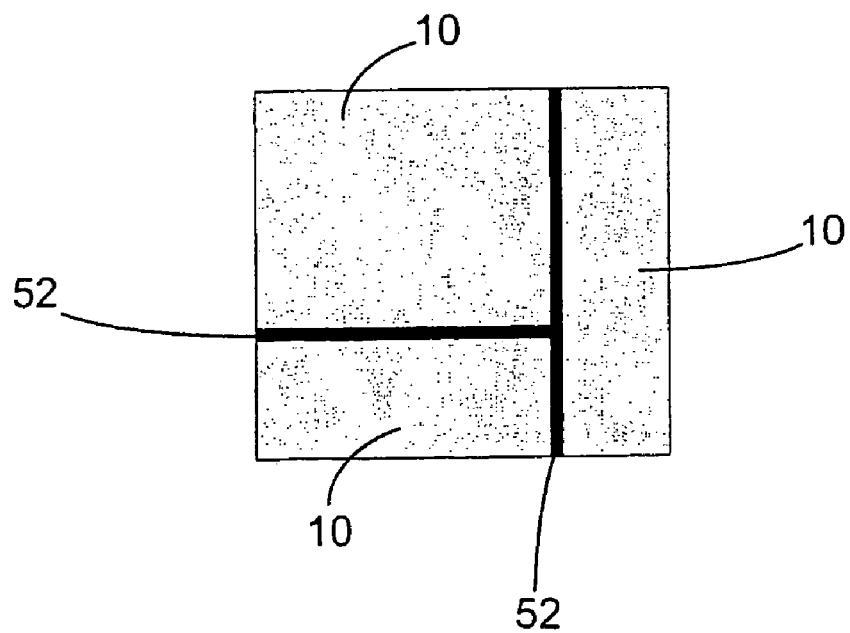
FIG. 14

GLASS-BASED SOI STRUCTURES

CROSS REFERENCE TO RELATED APPLICATION

This application is a continuation-in-part of U.S. patent application Ser. No. 10/779,582, filed Feb. 12, 2004 now U.S. Pat. No. 7,176,528, which claims the benefit under 35 USC §119(e) of U.S. Provisional Application No. 60/448,176 filed Feb. 18, 2003, the entire contents of which are hereby incorporated by reference.

BACKGROUND

This invention relates to semiconductor-on-insulator (SOI) structures. More particularly, the invention relates to 1) methods for making such structures and 2) novel forms of such structures.

To date, the semiconductor material most commonly used in semiconductor-on-insulator structures has been silicon. Such structures have been referred to in the literature as silicon-on-insulator structures and the abbreviation "SOI" has been applied to such structures. The present invention relates to semiconductor-on-insulator structures in general, including silicon-on-insulator structures.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way.

The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOGs.

Silicon-on-insulator technology is becoming increasingly important for high performance thin film transistors, solar cells, and displays, such as, active matrix displays. The silicon-on-insulator wafers consist of a thin layer of substantially single crystal silicon (generally 0.1-0.3 microns in thickness but, in some cases, as thick as 5 microns) on an insulating material.

Various ways of obtaining such a wafer include epitaxial growth of Si on lattice matched substrates; bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon; or ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation. Of these three approaches, the approaches based on ion implantation have been found to be more practical commercially. In particular, the hydrogen ion implantation method has an advantage over the oxygen implantation process in that the implantation energies required are less than 50% of that of oxygen ion implants and the dosage required is two orders of magnitude lower.

Exfoliation by the hydrogen ion implantation method was initially taught in, for example, Bister et al., "Ranges of the 0.3-2 MeV $H^+$ and 0.7-2 MeV $H_2^+$ Ions in Si and Ge," *Radiation Effects*, 1982, 59:199-202, and has been further demonstrated by Michel Bruel. See Bruel, U.S. Pat. No. 5,374,564; M. Bruel, *Electronic Lett*. 31, 1995 pp 1201-1202; and L. Dicioccio, Y. Letiec, F. Letertre, C. Jaussad and M. Bruel, *Electronic Lett*. 32, 1996, pp 1144-1145.

The method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond.

The wafers are then heat-treated to about 600° C. to cause growth of the subsurface flaws for use in separating a thin layer of silicon from the Si wafer. The resulting assembly is then heated to a temperature above 1,000° C. to fully bond the Si film with $SiO_2$ underlayer to the support substrate, i.e., the unimplanted Si wafer. This process thus forms a silicon-on-insulator structure with a thin film of silicon bonded to another silicon wafer with an oxide insulator layer in between.

Cost is an important consideration for commercial applications of SOI structures. To date, a major part of the cost of such structures has been the cost of the silicon wafer which supports the oxide layer, topped by the Si thin film, i.e., a major part of the cost has been the support substrate.

Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

As the present inventors discovered, it is not at all a simple matter to replace a silicon wafer with a wafer made out of a less expensive material in an SOI structure. In particular, it is difficult to replace a silicon wafer with a glass or glass-ceramic of the type which can be manufactured in large quantities at low cost, i.e., it is difficult to make cost effective SOG structures. This is so because prior to the present invention, the art has not had practical techniques for using glass or glass-ceramics as support substrates in semiconductor-on-insulator structures.

The present invention provides such techniques and thus satisfies the longstanding need in the art for lower cost substrates for SOI structures. In addition, the invention provides novel forms for such structures. Among the numerous applications for the invention are those in such fields as optoelectronics, RF electronics, and mixed signal (analog/digital) electronics, as well as display applications, e.g., LCDs and OLEDs, where significantly enhanced performance can be achieved compared to amorphous and polysilicon based devices. In addition, photovoltaics and solar cells with high efficiency are also enabled. Both the invention's novel processing techniques and its novel SOI structures significantly lower the cost of an SOI structure and thus satisfy the continuing demand in the semiconductor field for lower cost devices.

SUMMARY OF THE INVENTION

In accordance with a first aspect, the invention provides a method for producing a semiconductor-on-insulator structure, specifically, an SOG structure, comprising:

(A) providing first and second substrates (10,20) wherein:
  (1) the first substrate (10) comprises a first external surface (11) for bonding to the second substrate (the first bonding surface), a second external surface (12) for applying force to the first substrate (the first force-applying surface), and an internal zone (13) for separating the first substrate into a first part (14) and a second part (15) (the internal zone (13) is hereinafter referred to as the "separation zone," which, for example, can be a hydrogen ion implantation zone), wherein:
    (a) the first bonding surface (11), the first force-applying surface (12), and the separation zone (13) are substantially parallel to one another;
    (b) the second part (15) is between the separation zone (13) and the first bonding surface (11); and
    (c) the first substrate (10) comprises a substantially single-crystal semiconductor material; and
  (2) the second substrate (20) comprises two external surfaces (21,22), one for bonding to the first substrate (the second bonding surface) and another for applying force to the second substrate (the second force-applying surface), wherein:
    (a) the second bonding surface (21) and the second force-applying surface (22) are substantially parallel to one another and are separated from one another by a distance $D_2$; and
    (b) the second substrate (20) comprises an oxide glass or an oxide glass-ceramic;

(B) bringing the first and second bonding surfaces (11,21) into contact (once brought into contact, the first and second bonding surfaces form what is referred to herein as the "interface" between the first and second substrates);

(C) for a period of time sufficient for the first and second substrates to bond to one another at the first and second bonding surfaces (i.e., at the interface), simultaneously:
  (1) applying force to the first and second force-applying surfaces (12,22) to press the first and second bonding surfaces (11,21) together;
  (2) subjecting the first and second substrates (10,20) to an electric field which is characterized by first and second voltages $V_1$ and $V_2$ at the first and second force-applying surfaces (12,22), respectively, said voltages being uniform at those surfaces with $V_1$ being higher than $V_2$ so that the electric field is directed from the first substrate (10) to the second substrate (20); and
  (3) heating the first and second substrates (10,20), said heating being characterized by first and second temperatures $T_1$ and $T_2$ at the first and second force-applying surfaces (12,22), respectively, said temperatures being uniform at those surfaces and being selected so that upon cooling to a common temperature, the first and second substrates (10,20) undergo differential contraction to thereby weaken the first substrate (10) at the separation zone (13); and (D) cooling the bonded first and second substrates (10,20) (e.g., to a common temperature such as room temperature) and separating the first and second parts (14,15) at the separation zone (13);

wherein the oxide glass or oxide glass-ceramic has one or both of the following sets of characteristics: (i) the oxide glass or oxide glass-ceramic has a strain point of less than 1,000° C. and comprises positive ions (e.g., alkali or alkaline-earth ions) which during step (C), move within the second substrate (20) in a direction away from the second bonding surface (21) and towards the second force-applying surface (22); and/or (ii) the oxide glass or oxide glass-ceramic comprises (a) non-bridging oxygens and (b) positive ions (e.g., alkali or alkaline-earth ions) which during step (C), move within the second substrate (20) in a direction away from the second bonding surface (21) and towards the second force-applying surface (22).

As known in the art, non-bridging oxygens in an oxide glass or in the glass phase of an oxide glass-ceramic are those oxygens contributed to the glass by non-network forming components of the glass. For example, in the case of commercially available LCD display glass such as CORNING INCORPORATED GLASS COMPOSITION NO. 1737 and CORNING INCORPORATED GLASS COMPOSITION NO. EAGLE 2000™, the non-bridging oxygens include those oxygens which are part of the glass through the incorporation of alkaline-earth oxides (e.g., MgO, CaO, SrO, and/or BaO) in the glass composition.

Although not wishing to be bound by any particular theory of operation, it is believed that an electrolysis-type reaction takes place during step (C). In particular, it is believed that the semiconductor substrate (first substrate) serves as the positive electrode for the electrolysis-type reaction and that reactive oxygen is produced in the region of the interface between the first and second substrates. This oxygen is believed to react with the semiconductor material (e.g., silicon) forming, in situ, a hybrid region (16) of oxidized semiconductor (e.g., a silicon oxide region for a silicon-based semiconductor). This hybrid region begins at the interface and extends into the first substrate. The presence of non-bridging oxygens in the oxide glass or oxide glass-ceramic of the second substrate is believed to play a role in the generation of the oxygens that react with the semiconductor material of the first substrate.

It is believed that such generation of reactive oxygen and its combination with the semiconductor material is a source of the strong bond which the invention achieves between the semiconductor material of the first substrate and the oxide glass or oxide glass-ceramic of the second substrate, i.e., at least a part (and potentially all) of the bond between the first and second substrates is through the reaction of the semiconductor material with reactive oxygen originating from the second substrate. Significantly, unlike prior techniques, this strong bond is achieved without the need for a high temperature treatment, i.e., a treatment at a temperature above 1,000° C.

This ability to avoid high temperature processing allows the second substrate to be a material which can be manufactured in large quantities at low cost. That is, by eliminating high temperature processing, the invention eliminates the need for a support substrate composed of an expensive high temperature material, such as, silicon, quartz, diamond, sapphire, etc.

In particular, the ability to achieve a strong bond without the need for a high temperature treatment allows the second substrate to be composed of an oxide glass or an oxide glass-ceramic; in one embodiment the glass or glass-ceramic exhibits a a strain point less than 1,000° C. More particularly, for display applications, the oxide glass or oxide glass-ceramic typically has a strain point less than 800° C., and in further embodiments less than 700° C. For electronics and other applications, the strain point is preferably less than 1,000° C. As well known in the glass making art, glasses and glass-ceramics having lower strain points are easier to manufacture than glasses and glass-ceramics having higher strain points.

To facilitate bonding, the oxide glass or oxide glass-ceramic should be able to conduct electricity at least to some extent. The conductivity of oxide glasses and oxide glass-ceramics depends on their temperature and thus in achieving a strong bond between the semiconductor material and the oxide glass or oxide glass-ceramic, there is a balance among: 1) the conductivity of the glass or glass-ceramic, 2) the temperatures ($T_1$ and $T_2$) used in step (C), 3) the strength of the electric field applied to the first and second substrates during step (C), and 4) the amount of time during which step (C) is performed.

As a general guideline, the oxide glass or oxide glass-ceramic preferably has a resistivity $\rho$ at 250° C. that is less than or equal to $10^{16}$ $\Omega$-cm (i.e., a conductivity at 250° C. that is greater than or equal to $10^{-16}$ Siemens/cm). More preferably, $\rho$ at 250° C. is less than or equal to 1013 $\Omega$-cm, and most preferably, it is less than or equal to $10^{11.5}$ $\Omega$-cm. It should be noted that although quartz has the requisite resistivity at 250° C. of $10^{11.8}$ $\Omega$-cm, it lacks positive ions that can move during step (C), and it thus follows that quartz is unsuitable for use as the second substrate in producing SOI structures in accordance with the above procedures.

For any particular set of first and second substrates, persons skilled in the art will readily be able to determine suitable combinations of time, temperature, and field strength for step (C) from the present disclosure. In particular, such persons will be able to select combinations of these parameters which create a bond between the semiconductor and the oxide glass or oxide glass-ceramic which is strong enough for the SOI structure to withstand the various forces and environmental conditions to which it will be exposed during further processing and/or use.

In addition to the above role in bonding, the electric field applied in step (C) also moves positive ions (cations) within the second substrate in a direction from the second substrate's bonding surface (the second bonding surface) towards its force-applying surface (the second force-applying surface). Such movement preferably forms a depletion region (23) which begins at the interface between the first and second substrates and extends into the second substrate, i.e., the depletion region begins at the second bonding surface and extends into the second substrate towards the second force-applying surface.

The formation of such a depletion region is especially desirable when the oxide glass or oxide glass-ceramic contains alkali ions, e.g., $Li^{+1}$, $Na^{+1}$, and/or $K^{+1}$ ions, since such ions are known to interfere with the operation of semiconductor devices. Alkaline-earth ions, e.g., $Mg^{+2}$, $Ca^{+2}$, $Sr^{+2}$, and/or $Ba^{+2}$, can also interfere with the operation of semiconductor devices and thus the depletion region also preferably has reduced concentrations of these ions.

Significantly, it has been found that the depletion region once formed is stable over time even if the SOI structure is heated to an elevated temperature comparable to, or even to some extent higher than, that used in step (C). Having been formed at an elevated temperature, the depletion region is especially stable at the normal operating and formation temperatures of SOI structures. These considerations ensure that alkali and alkaline-earth ions will not diffuse back from the oxide glass or oxide glass-ceramic into the semiconductor of the SOI structure during use or further device processing, which is an important benefit derived from using an electric field as part of the bonding process of step (C).

As with selecting the operating parameters to achieve a strong bond, the operating parameters needed to achieve a depletion region of a desired width and a desired reduced positive ion concentration for all of the positive ions of concern can be readily determined by persons skilled in the art from the present disclosure. When present, the depletion region is a characteristic feature of an SOI structure produced in accordance with the method aspects of the present invention.

In addition to the depletion region, the application of the electric field can also create "pile-up" regions for one or more of the mobile positive ions contained in the oxide glass or oxide glass-ceramic. When present, such regions are located at or near the side (edge) of the depletion region farthest from the interface between the first and second substrates. Within the pile-up region, the positive ion has a concentration above its bulk concentration. For example, when measured in atomic percent, the peak concentration of the positive ion in the pile-up region can be, for example, up to 5 times greater than the bulk concentration. Like the depletion region, such a pile-up region, when present, is a characteristic feature of an SOI structure produced in accordance with the method aspects of the present invention.

The temperatures of the first and second substrates during step (C), i.e., the values of $T_1$ and $T_2$, are chosen to perform the important function of weakening (e.g., fracturing) the semiconductor substrate (first substrate) at the separation zone so that the first substrate can be divided into first and second parts, the second part being bonded to the second substrate. In this way, an SOI structure having a semiconductor portion of a desired thickness is achieved, e.g., a thickness $D_S$ between, for example, 10 nanometers and 500 nanometers and, in some cases, up to 5 microns.

Although not wishing to be bound by any particular theory of operation, it is believed that the weakening of the semiconductor substrate at the separation zone primarily occurs as the bonded first and second substrates are cooled after step (C), e.g., to room temperature. By the proper selection of $T_1$ and $T_2$ (see below), this cooling causes the first and second substrates to differentially contract. This differential contraction applies stress to the first substrate which manifests itself as a weakening/fracturing of the first substrate at the separation zone. As discussed below, preferably, the differential contraction is such that the second substrate seeks to contract more than the first substrate.

As used herein, the phrase "differential contraction upon cooling to a common temperature" and similar phrases mean that if the first and second substrates were not bonded, they would contract to different extents by such cooling. However, since the first and second substrates become bonded during step (C) and are rigid materials, the amount of contraction of the individual substrates which actually occurs will be different from that which would occur if there were no bonding. This difference leads to one of the substrates experiencing tension and the other compression as a result of the cooling. The phrase "seeks to contract" and similar phrases are used herein to reflect the fact that the contraction of the substrates when bonded will in general be different from their non-bonded contraction, e.g., the substrate being discussed may seek to contract to a certain extent as a result of the cooling but may not and, in general, will not actually contract to that extent as a result of being bonded to the other substrate.

The values of $T_1$ and $T_2$ used during step (C) will depend on the relative coefficients of thermal expansion of the first and second substrates, the goal in choosing these values being to ensure that one of the substrates, preferably, the second substrate, seeks to contract to a greater extent than the other substrate, preferably, the first substrate, so as to apply stress to, and thus weaken, the separation zone during cooling.

In general terms, in order for the second substrate to seek to contract to a greater extent than the first substrate during cooling, $T_1$, $T_2$, and the CTE's of the first and second substrates ($CTE_1$ and $CTE_2$, respectively) should satisfy the relationship:

$$CTE_2 \cdot T_2 > CTE_1 \cdot T_1,$$

where $CTE_1$ is the 0° C. coefficient of thermal expansion of the substantially single-crystal semiconductor material and $CTE_2$ is the 0-300° C. coefficient of thermal expansion of the oxide glass or oxide glass-ceramic. This relationship assumes that the first and second substrates are cooled to a common reference temperature of 0° C.

In applying this relationship, it should be kept in mind that the oxide glass or oxide glass-ceramic preferably has a 0-300° C. coefficient of thermal expansion CTE which satisfies the relationship:

$$5 \times 10^{-7}/°\text{C.} \leq CTE \leq 75 \times 10^{-7}/°\text{C.}$$

For comparison, the 0° C. coefficient of thermal expansion of substantially single-crystal silicon is approximately $24 \times 10^{-7}/°$ C., while the 0-300° C. average CTE is approximately $32.3 \times 10^{-7}/°$ C. Although a CTE for the second substrate which is less than or equal to $75 \times 10^{-7}/°$ C. is generally preferred, in some cases, the CTE of the second substrate can be above $75 \times 10^{-7}/°$ C., e.g., in the case of soda lime glasses for use in such applications as solar cells.

As can be seen from the $CTE_2 \cdot T_2 > CTE_1 \cdot T_1$ relationship, when the CTE of the oxide glass or oxide glass-ceramic ($CTE_2$) is less than that of the semiconductor material ($CTE_1$), a larger $T_2-T_1$ difference will be needed in order for the second substrate to seek to contract more than the first substrate during cooling. Conversely, if the CTE of the oxide glass or oxide glass-ceramic is greater than that of the semiconductor material, a smaller $T_2-T_1$ difference can be used. Indeed, if the CTE of the oxide glass or oxide glass-ceramic is sufficiently above than that of the semiconductor material, the $T_2-T_1$ difference can become zero or even negative. However, in general, the CTE of the oxide glass or oxide glass-ceramic is chosen to be relatively close to that of the semiconductor material so that a positive $T_2-T_1$ difference is needed to ensure that the second substrate will seek to contract more than the first substrate during cooling. Having $T_2 > T_1$ is also desirable since it can aid in bonding of the oxide glass or oxide glass-ceramic to the semiconductor material since it tends to make the oxide glass or oxide glass-ceramic more reactive. Also, having $T_2 > T_1$ is desirable since it can facilitate movement of positive ions away from the interface between the first and second substrates.

The differential contraction between the first and second substrates during cooling and the resulting weakening/fracturing of the first substrate at the separation zone can be achieved by approaches other than having the second substrate seek to contract more than the first substrate during the cooling. In particular, it can be the first substrate that seeks to contract more than the second substrate. Again, this differential contraction is achieved through the selection of the CTE's and temperatures of the first and second substrates. In general terms, for this case, $CTE_1 \cdot T_1$ needs to be greater than $CTE_2 \cdot T_2$.

When the first substrate seeks to contract more than the second substrate, the first substrate and, in particular, the second part of the first substrate, will end up under tension, rather than under compression, at the end of the cooling. In general, it is preferred for the semiconductor film (second part of the first substrate) to be under compression in the finished SOI structure, which makes the approach in which the differential contraction causes the second substrate to seek to contract more than the first substrate during cooling preferred. For some applications, however, having the semiconductor film under some tension may be preferred.

For example, having the semiconductor film under some tension may be useful in obtaining higher electron mobilities through the "strained silicon effect." See, for example, U.S. Pat. Nos. 5,442,205, 6,107,653, 6,573,126, and 6,593,641. Such a condition for the semiconductor film can be readily achieved in accordance with the present invention through the choice of $T_1$, $T_2$, and $CTE_2$ for a given $CTE_1$. Examples of oxide glasses and oxide-glass ceramics which have relatively low CTE's and thus will contract less than a semiconductor film, e.g., a silicon semiconductor film, include those oxide glasses and glass-ceramics exhibiting a CTE of less than about $15 \times 10^{-7}/°$ C. (0-300° C.).

Thus, to summarize, although other sets of conditions can be used in the practice of the invention, in the preferred embodiments of the invention, $T_2$ is greater than $T_1$ during step (C) and the second substrate seeks to contract more than the first substrate during cooling from the elevated temperatures used during step (C).

Again, for any particular application of the invention (e.g., any particular semiconductor material and any particular oxide glass or oxide glass-ceramic), persons skilled in the art will readily be able to select values for $T_1$ and $T_2$ based on the present disclosure which will provide a level of differential contraction sufficient to weaken the separation zone so that the first and second parts of the first substrate can be separated from one another to produce the desired SOI structure.

As discussed in further detail below in connection with FIG. 1D, separation of the first and second parts at the separation zone results in each part having an "exfoliation" surface where the separation occurred. As known in the art, upon initial formation, i.e., before any subsequent surface treatments, such an exfoliation surface is characterized by a surface roughness which is generally at least on the order of 0.5 nanometers RMS, e.g., in the range of 1-100 nanometers, and depending on the process conditions used, will typically have a concentration of the implanted ion used to form the separation zone, e.g., hydrogen, above that present in the body of the first or second parts. The exfoliation surface as initially formed will also be characterized by a distorted crystal structure as seen by TEM. In typical applications, the exfoliation surface is polished prior to use so that its RMS surface roughness is reduced to 1 nanometer or less, e.g., to a RMS surface roughness on the order of 0.1 nanometers for electronic applications. As used herein, the phrase "exfoliation surface" includes the surface as initially formed and the surface after any subsequent treatments.

The pressure applied to the first and second substrates during step (C) ensures that those substrates are in intimate contact while undergoing the heat and electric field treatments of that step. In this way, strong bonding between the substrates can be achieved.

Generally, the semiconductor substrate (the first substrate) will be able to withstand higher levels of applied pressure than the glass or glass-ceramic substrate (the second substrate). Thus, the pressure is chosen to provide intimate contact between the substrates without damaging the second substrate.

A wide range of pressures can be used. For example, the force per unit area P applied to the first and second force-applying surfaces of the first and second substrates, respectively, preferably satisfies the relationship:

$1\ psi \leq P \leq 100\ psi$;

and most preferably, the relationship:

$1\ psi \leq P \leq 50\ psi$.

Again, the specific pressure value to be used for any particular application of the invention can be readily determined by persons skilled in the art from the present disclosure.

The first aspect of the invention can be practiced using a single first substrate and a single second substrate. Alternatively, the methods of the invention can be used to form more than one SOI structure on a single second substrate.

For example, steps (A) through (D) can be used to form a first SOI structure which does not cover the entire area of the second substrate. Thereafter, steps (A) through (D) can be repeated to form a second SOI structure which covers all or part of the area not covered by the first SOI structure. The second SOI structure may be the same or different from the first SOI structure, e.g., the second SOI structure can be made using a first substrate composed of a substantially single-crystal semiconductor material that is the same or different from the semiconductor material of the first substrate used in producing the first SOI structure.

More preferably, multiple SOI structures are formed simultaneously on a single second substrate by providing multiple (i.e., two or more) first substrates in step (A), bringing all of those first substrates into contact with a single second substrate in step (B), and then performing steps (C) and (D) on the resulting multiple first substrate/single second substrate assembly. The multiple first substrates provided in step (A) can all be the same, all different, or some the same and some different.

Whichever approach is used, the resulting multiple SOI structures on a single oxide glass or oxide glass-ceramic substrate can be contiguous or separated as appropriate for the particular application of the invention. If desired, gaps between some or all of the adjacent structures can be filled with, for example, semiconductor material to obtain one or more continuous semiconductor layers on an oxide glass or oxide glass-ceramic substrate of any desired size.

In addition to the foregoing method aspects, the invention also provides novel SOI structures.

Thus, in accordance with a second aspect, the invention provides a semiconductor-on-insulator structure comprising first and second layers (15,20) which are attached to one another either directly or through one or more intermediate layers, wherein: (a) the first layer (15) comprises a substantially single-crystal semiconductor material; (b) the second layer (20) comprises an oxide glass or an oxide glass-ceramic; and (c) the bond strength between the first and second layers is at least 8 joules/meter$^2$, preferably at least 10 joules/meter$^2$, and most preferably at least 15 joules/meter$^2$.

As used throughout this specification and in the claims, the bond strength between a semiconductor layer and a glass or glass-ceramic layer of an SOI structure is determined using an indentation procedure. Such procedures are widely used to assess the adhesion characteristics of thin films and coatings to a wide variety of materials, including polymeric, metallic, and brittle materials. The technique provides a quantitative measure of adhesion in the form of the interfacial strain energy release rate.

In the examples presented below, indentation measurements of silicon coatings on glass were performed using a Nano Indenter II (MTS Systems Corporation, Eden Prairie, Minn.) equipped with a Berkovich diamond indenter. Other equipment can, of course, be used to determine bond strength values. As discussed in detail in Example 12 below, indentations were made covering a range of loads and the region immediately surrounding the indentations was examined for evidence of delamination. Calculations of bond energies were made in accordance with the following reference, the relevant portions of which are incorporated herein by reference: D. B. Marshall and A. G. Evans, Measurement of Adherence of Residually Stressed Thin Films by Indentation. I. Mechanics of Interface Delamination, J. Appl. Phys., 56 [10] 2632-2638 (1984). The procedures of this reference are to be used in calculating the bond energies called for by the claims set forth below.

When the SOI structure is produced using, for example, the first aspect of the invention, the first layer will have a surface (second face 13b) farthest from the second layer which is an exfoliation surface. In this case, the oxide glass or oxide glass ceramic of the second layer will also preferably have:

(a) 0-300° C. coefficient of thermal expansion CTE and a 250° C. resistivity ρ which satisfy the relationships:

$5 \times 10^{-7}/°C. \leq CTE \leq 75 \times 10^{-7}/°C.$, and $\rho \leq 10^{16}\ \Omega\text{-cm}$, and (b) a strain point $T_s$ of less than 1,000° C.

The oxide glass or oxide glass ceramic will also comprise positive ions whose distribution within the oxide glass or oxide glass-ceramic can be altered by an electric field when the temperature T of the oxide glass or oxide glass-ceramic satisfies the relationship:

$T_s - 350 \leq T \leq T_s + 350$, where $T_s$ and T are in degrees centigrade.

As will be appreciated, the strength of the bond between the glass or glass-ceramic layer and the semiconductor layer, e.g., silicon layer, attached thereto is a key property of an SOI structure. High bond strength and durability are very important to ensure that the SOI structure can withstand the processing associated with the manufacture of thin film transistors and other devices on or within the structure. For example, a high bond strength is important in providing device integrity during cutting, polishing, and similar processing steps. A high bond strength also allows semiconductor films of various thicknesses to be processed while attached to glass or glass-ceramic substrates, including thin semiconductor films.

It is known that the bond energy for the Si—SiO$_2$ bond for the standard thermal process for producing SOI structures depends on annealing temperature and is in the range of 1-4 joules/meter$^2$ after a 1100° C. anneal. See Semiconductor Wafer Bonding, Q. Y. Tong, U. Gosele, John Wiley & Sons Inc., New York, N.Y., page 108, (1994). As demonstrated by the examples set forth below, in accordance with the second aspect of the invention, bond strengths for SOI structures much higher than those previously achieved are provided, i.e., bond strengths of at least 8 joules/meter$^2$.

In accordance with a third aspect, the invention provides a semiconductor-on-insulator structure comprising first and second layers (15,20) which are attached to one another either directly or through one or more intermediate layers, wherein:

(a) the first layer (15):
  (i) comprises a substantially single-crystal semiconductor material;
  (ii) has first and second substantially parallel faces (11, 13b) separated by a distance $D_S$, the first face (11) being closer to the second layer (20) than the second face (13b);

(iii) has a reference surface (17) which 1) is within the first layer (15), 2) is substantially parallel to the first face (11), and 3) is separated from that face by a distance $D_S/2$; and (iv) has a region (16) of enhanced oxygen concentration which begins at the first face (11) and extends towards the second face (13b), said region having a thickness $\delta_H$ which satisfies the relationship:

$$\delta_H \leq 200 \text{ nanometers,}$$

where $\delta_H$ is the distance between the first face (11) and a surface (16a) which 1) is within the first layer (15), 2) is substantially parallel to the first face (11), and 3) is the surface farthest from the first face (11) for which the following relationship is satisfied:

$$C_O(x) - C_{O/Ref} \geq 50 \text{ percent, } 0 \leq x \leq \delta_H,$$

where $C_O(x)$ is the concentration of oxygen as a function of distance x from the first face (11), $C_o$/Ref is the concentration of oxygen at the reference surface (17), and $C_o(x)$ and $C_o$/Ref are in atomic percent; and (b) the second layer (20) comprises an oxide glass or an oxide glass-ceramic.

It should be noted that the region of enhanced oxygen concentration of this aspect of the invention is to be distinguished from an oxide layer formed on the outside of the semiconductor substrate prior to bonding (see, for example, U.S. Pat. No. 5,909,627) in that the region of the present invention is within the semiconductor material. In particular, when the SOI structure is produced using, for example, the first aspect of the invention, the region of enhanced oxygen concentration is formed in situ as the composite of the semiconductor layer and the oxide glass or oxide glass-layer is formed.

In accordance with a fourth aspect, the invention provides a semiconductor-on-insulator structure comprising first and second layers (15,20) which are attached to one another either directly or through one or more intermediate layers, wherein:

(a) the first layer (15) comprises a substantially single-crystal semiconductor material, said layer having a surface (second face 13b) farthest from the second layer which is an exfoliation surface; and (b) the second layer (20): (i) has first and second substantially parallel faces (21,22) separated by a distance $D_2$, the first face (21) being closer to the first layer (15) than the second face (22); (ii) has a reference surface (24) which 1) is within the second layer (20), 2) is substantially parallel to the first face (21), and 3) is separated from that face by a distance $D_2/2$; (iii) comprises an oxide glass or an oxide glass-ceramic which comprises positive ions of one or more types, each type of positive ion having a reference concentration $C_{i/Ref}$ at the reference surface; and (iv) has a region (23) which begins at the first face (21) and extends towards the reference surface (24) in which the concentration of at least one type of positive ion is depleted relative to the reference concentration $C_{i/Ref}$ for that ion (the positive ion depletion region).

In accordance with a fifth aspect, the invention provides a semiconductor-on-insulator structure comprising first and second layers (15,20) which are attached to one another either directly or through one or more intermediate layers, wherein:

(a) the first layer (15) comprises a substantially single-crystal semiconductor material, said layer having a thickness of less than 10 microns (preferably, less than 5 microns, more preferably, less than 1 micron); and (b) the second layer (20): (i) has first and second substantially parallel faces (21,22) separated by a distance $D_2$, the first face (21) being closer to the first layer (15) than the second face (22); (ii) has a reference surface (24) which 1) is within the second layer (20), 2) is substantially parallel to the first face (21), and 3) is separated from that face by a distance $D_2/2$; (iii) comprises an oxide glass or an oxide glass-ceramic which comprises positive ions of one or more types, each type of positive ion having a reference concentration $C_{i/Ref}$ at the reference surface; and (iv) has a region (23) which begins at the first face (21) and extends towards the reference surface (24) in which the concentration of at least one type of positive ion is depleted relative to the reference concentration $C_{i/Ref}$ for that ion (the positive ion depletion region).

In connection with this aspect of the invention, it should be noted that the 10 micron limitation of subparagraph (a) is substantially less than the thickness of a semiconductor wafer. For example, commercially available silicon wafers have thicknesses greater than 100 microns.

In accordance with a sixth aspect, the invention provides a semiconductor-on-insulator structure comprising first and second layers (15,20) which are attached to one another either directly or through one or more intermediate layers, wherein:

(a) the first layer (15) comprises a substantially single-crystal semiconductor material; and (b) the second layer (20) comprises an oxide glass or an oxide glass-ceramic which comprises positive ions of one or more types, wherein the sum of the concentrations of lithium, sodium, and potassium ions in the oxide glass or oxide glass-ceramic on an oxide basis is less than 1.0 weight percent and, preferably, less than 0.1 weight percent (i.e., wt. % $Li_2O$+wt. % $K_2O$+wt. % $Na_2O$<1.0 wt. %, preferably, <0.1 wt. %), wherein the first layer (15) has a maximum dimension (e.g., diameter in the case of a circular layer, diagonal in the case of a rectangular layer, etc.) greater than 10 centimeters.

In accordance with a seventh aspect, the invention provides a semiconductor-on-insulator structure comprising first and second layers (15,20) which are attached to one another either directly or through one or more intermediate layers, wherein:

(a) the first layer (15) comprises a substantially single-crystal semiconductor material; and (b) the second layer (20): (i) has first and second substantially parallel faces (21,22) separated by a distance $D_2$, the first face (21) being closer to the first layer (15) than the second face (22); (ii) has a reference surface (24) which 1) is within the second layer (20), 2) is substantially parallel to the first face (21), and 3) is separated from that face by a distance $D_2/2$; (iii) comprises an oxide glass or an oxide glass-ceramic which comprises positive ions of one or more types, each type of positive ion having a reference concentration $C_{i/Ref}$ at the reference surface; (iv) has a region (23) which begins at the first face (21) and extends towards the reference surface (24) in which the concentration of at least one type of positive ion is depleted relative to the reference concentration $C_{i/Ref}$ for that ion (the positive ion depletion region), said region having a distal edge (23a) (i.e., the edge closest to the reference surface); and (v) has a region (25) in the vicinity of said distal edge of the positive ion depletion region (23) in which the concentration of at least one type of positive ion is enhanced relative to $C_{i/Ref}$ for that ion (the pile-up region).

In accordance with an eighth aspect, the invention provides a semiconductor-on-insulator structure comprising first and second layers (15,20) which are attached to one another either directly or through one or more intermediate layers with a bond strength of at least 8 joules/meter$^2$, preferably at least 10 joules/meter$^2$, and most preferably at least 15 joules/meter$^2$, said first layer (15) comprising a substantially single-crystal semiconductor material and said second layer (20) comprising an oxide glass or an oxide glass-ceramic wherein at least a portion of the first layer (15) proximal to the second layer (20) comprises recesses (18) which divide said portion into substantially isolated regions (19) which can expand and contract relatively independently of one another.

In certain preferred embodiments of this aspect of the invention, the recesses (18) extend through the entire thickness ($D_S$) of the first layer (15).

In accordance with a ninth aspect, the invention provides a silicon-on-insulator structure comprising first and second layers (15,20) which are directly attached to one another, said first layer (15) comprising a substantially single-crystal silicon material and said second layer (20) comprising a glass or a glass-ceramic which comprises silica and one or more other oxides as network formers (e.g., $B_2O_3$, $Al_2O_3$, and/or $P_2O_5$), said first layer (15) comprising a region (16) which contacts the second layer (20) and comprises silicon oxide (i.e., $SiO_x$ where $1 \leq x \leq 2$) but does not comprise the one or more other oxides, said region having a thickness which is less than or equal to 200 nanometers.

In accordance with a tenth aspect, the invention provides a semiconductor-on-insulator structure comprising a substantially single-crystal semiconductor material (material S) and an oxide glass or an oxide glass-ceramic which comprises positive ions (material G), wherein at least a part of the structure comprises in order: material S; material S with an enhanced oxygen content; material G with a reduced positive ion concentration for at least one type of positive ion; material G with an enhanced positive ion concentration for at least one type of positive ion; and material G.

In connection with each of the foregoing aspects of the invention, it should be noted that the "insulator" component of a semiconductor-on-insulator structure is automatically provided by the invention through the use of an oxide glass or an oxide glass-ceramic as the second substrate. The insulating function of the glass or glass-ceramic is even further enhanced when the interface (30) between the first and second substrates (10,20) includes a positive ion depletion region (23). As a specific example, in the tenth aspect, all of the G materials are insulators. In addition, the S material with enhanced oxygen concentration may, at least to some extent, function as an insulator depending on the oxygen concentration achieved. In such cases, everything after the S material constitutes the insulator of the SOI structure.

This automatic provision of the insulator function in accordance with the invention is to be contrasted with conventional SOI structures in which a semiconductor film is attached to a semiconductor wafer. To achieve an insulating function, an insulator layer, e.g., a $SiO_2$ layer, needs to be sandwiched (buried) between the semiconductor film and the semiconductor wafer.

As discussed above in connection with the first aspect of the invention, the methods of the present invention can be practiced to produce multiple SOI structures on a single oxide glass or oxide glass-ceramic substrate, where the SOI structures may all be the same, all different, or some the same and some different. Similarly, the product aspects of the invention can have multiple first layers (15) on a single second layer (20), where again, the first layers may all be the same, all different, or some the same and some different.

Whether a single first layer or a plurality of first layers are used, the resulting SOI structure can either have all or substantially all (i.e., >95%) of the first face (21) of the second layer (20) attached (either directly or through one or more intermediate layers) to one or more kinds of substantially single-crystal semiconductor materials, or can have substantial areas of the first face that are associated with materials that are not substantially single-crystal semiconductor materials (hereinafter, the "non-single crystal semiconductor areas").

In the non-single crystal semiconductor areas, the first face can be attached, either directly or through one or more intermediate layers, to, for example, amorphous and/or polycrystalline semiconductor materials, e.g., amorphous and/or polycrystalline silicon. The use of such less expensive materials can be particularly beneficial in display applications where substantially single-crystal semiconductor materials are typically only needed for certain parts of the display electronics, e.g., for peripheral drivers, image processors, timing controllers, and the like, that require higher performance semiconductor materials. As well-known in the art, polycrystalline semiconductor materials and, in particular, polycrystalline silicon can be obtained by thermal crystallization (e.g., laser-based thermal crystallization) of amorphous materials after those materials have been applied to a substrate, such as, an LCD glass substrate.

The entire first face of the second layer, of course, does not have to be associated with substantially single-crystal or non-single crystal semiconductor materials. Rather, specified areas can have the semiconductor materials with the spaces between such areas being either bare second layer or second layer attached to one or more non-semiconductor materials. The sizes of such spaces can be large or small as appropriate to the particular application of the invention. For example, in the case of display applications, e.g., liquid crystal displays, the great majority of the glass layer (e.g., greater than approximately 75-80%) will typically not be associated with either substantially single-crystal or non-single crystal semiconductor materials.

Through the use of multiple first layers attached to a single second layer, SOI structures having extensive areas composed of substantially single-crystal semiconductor materials can be obtained. Thus, in accordance with an eleventh aspect, the invention provides a semiconductor-on-insulator structure comprising first and second layers (15,20) which are attached to one another either directly or through one or more intermediate layers, wherein:

(a) the first layer (15) comprises a plurality of regions each of which comprises a substantially single-crystal semiconductor material;

(b) the second layer (20) comprises an oxide glass or an oxide glass-ceramic; and (c) the regions have surface areas $A_i$ which satisfy the relationship:

$$\sum_{i=1}^{N} A_i > A_T, N > 1,$$

where $A_T$=750 centimeters$^2$ if any of the regions has a circular perimeter and $A_T$=500 centimeters if none of the regions has a circular perimeter.

As above, the substantially single-crystal semiconductor materials of the various regions can all be the same, all different, or some the same and some different. Similarly, if one or more intermediate layers are used, they can all be the same, all different, or some the same and some different for the various regions. In particular, one or more regions can have the substantially single-crystal semiconductor material attached to the second layer through one or more intermediate layers, while one or more other regions can have the semiconductor material attached directly to the second layer.

In connection with the foregoing second through eleventh aspects of the invention, the one or more intermediate layers between the first and second substrates, if present, preferably have a combined thickness of less than 100 nm, more preferably less than 50 nm, and most preferably, less than 30 nm.

In accordance with one or more further aspects and/or embodiments of the present invention, a method of forming a semiconductor on glass structure includes: establishing an exfoliation layer on a semiconductor wafer; contacting the exfoliation layer of the semiconductor wafer to a glass substrate; applying pressure, temperature and voltage to the semiconductor wafer and the glass substrate, without a vacuum atmosphere, such that a bond is established therebetween via electrolysis; and applying stress such that the exfoliation layer separates from the semiconductor wafer and remains bonded to the glass substrate.

In accordance with one or more still further aspects and/or embodiments of the present invention, a process of forming a semiconductor on glass structure includes: establishing an exfoliation layer on a semiconductor wafer; contacting the exfoliation layer of the semiconductor wafer to a glass substrate; directly or indirectly contacting at least one heated platen to at least one of the semiconductor wafer and the glass substrate to elevate the temperatures thereof; applying pressure and voltage to the semiconductor wafer and the glass substrate such that a bond is established therebetween via electrolysis; and applying stress such that the exfoliation layer separates from the semiconductor wafer and remains bonded to the glass substrate.

The method may additionally or alternatively include: directly or indirectly contacting at least one heated platen to the semiconductor wafer such that a first temperature is achieved; and directly or indirectly contacting at least one heated platen to the glass substrate such that a second temperature is achieved. Preferably, the first temperature is below the second temperature.

In addition to the above-listed individual aspects, the invention also comprises any and all combinations of these aspects. For example, all embodiments of the invention preferably have an SOI structure which is characterized by a bond strength of at least 8 joules/meter$^2$, preferably at least 10 joules/meter$^2$, and most preferably at least 15 joules/meter$^2$. Similarly, the SOI structure preferably includes at least one exfoliation surface, at least one positive ion depletion region, at least one pile-up region, and/or a semiconductor layer whose thickness is less than 10 microns.

The reference numbers used in the summaries of the various aspects of the invention are only for the convenience of the reader and are not intended to and should not be interpreted as limiting the scope of the invention. More generally, it is to be understood that both the foregoing general description and the following detailed description are merely exemplary of the invention, and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. The schematic drawings are not intended to indicate scale or relative proportions of the elements shown therein.

Each of FIGS. 5A, 6A, 7A, and 8A shows SIMS signal intensity data, and each of FIGS. 5B, 6B, 7B, and 8B shows that data converted into atomic percent values.

Figure 9:
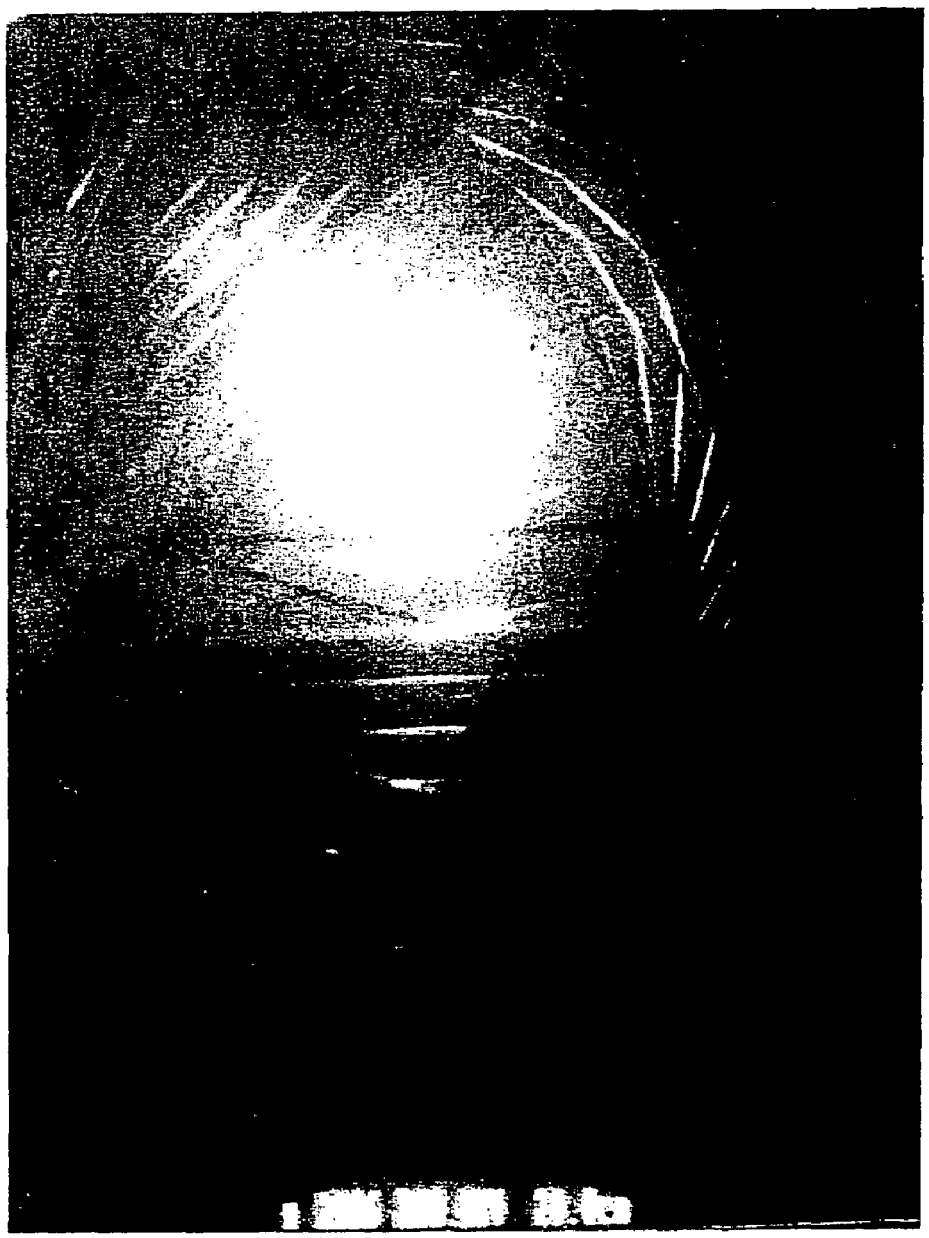

FIG. 9 is a convergent beam electron diffraction pattern illustrating the single crystal nature of the semiconductor layer of an SOI structure produced in accordance with the invention. The semiconductor film in this case is phosphorus-doped silicon (Si).

Figure 10A:
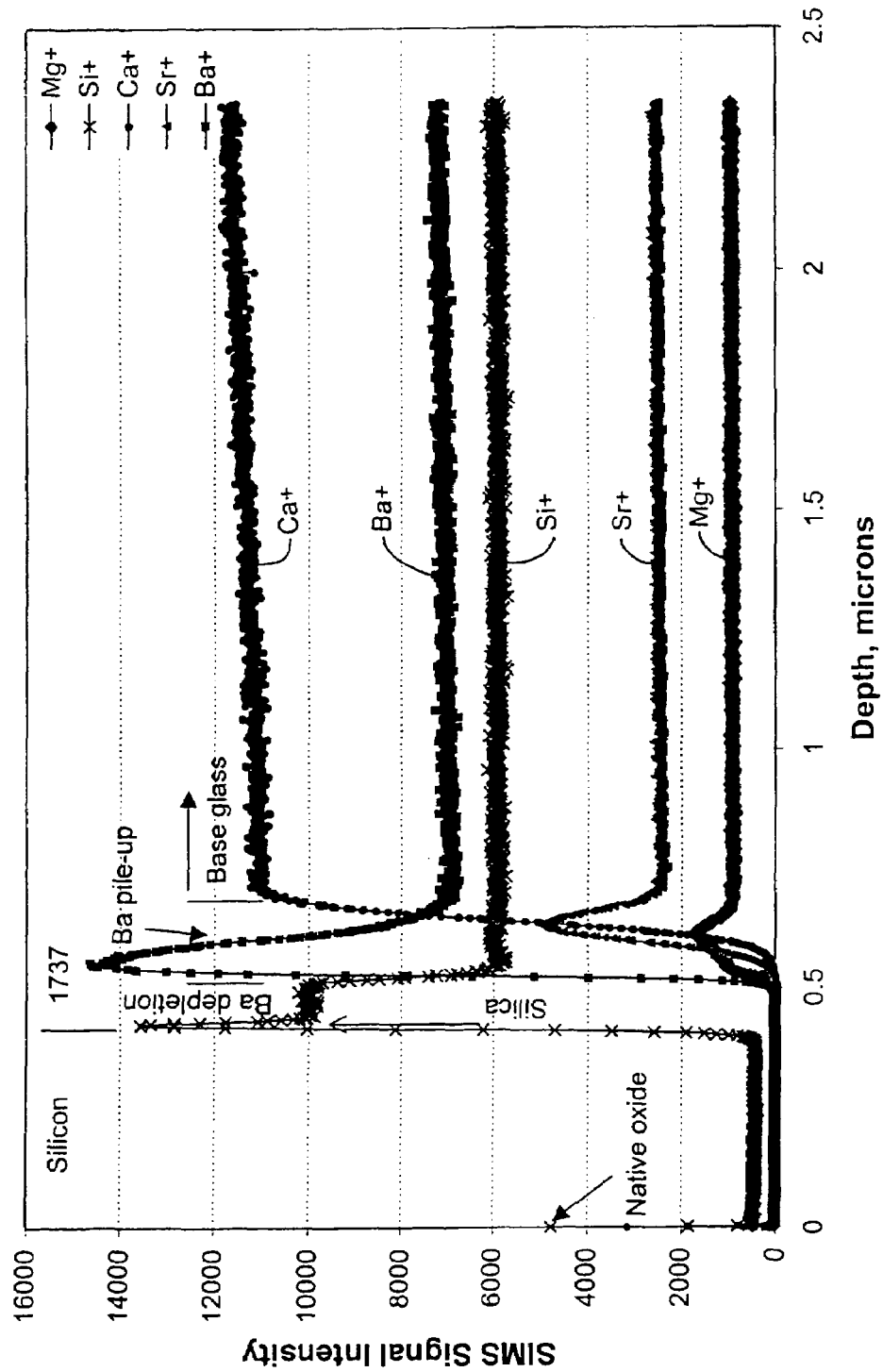
Figure 10B:
Figure 10C:
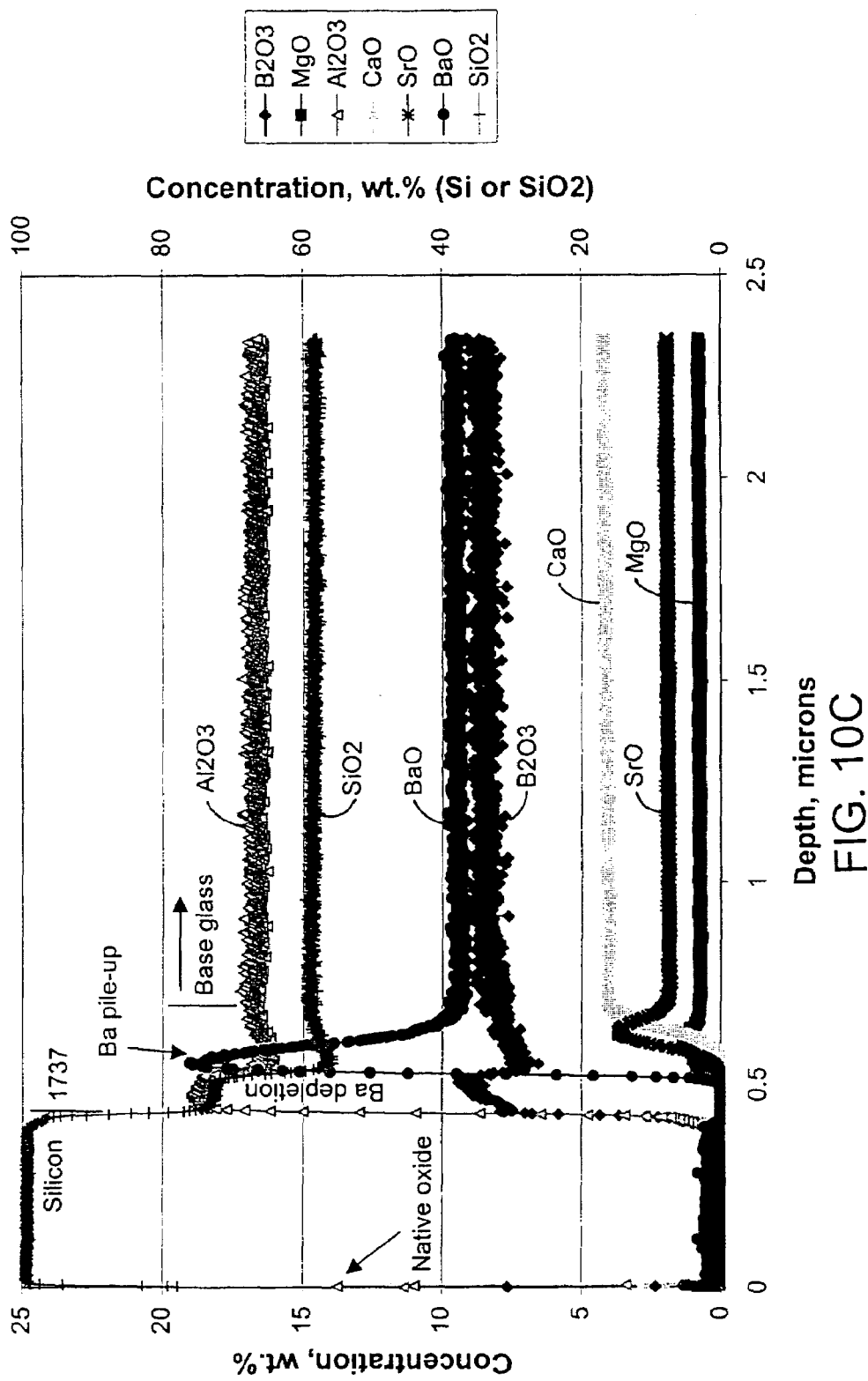

FIGS. 10A, 10B, and 10C are ToF-SIMS depth profiles of an SOI structure produced in accordance with the invention for a second substrate which comprises alkaline-earth ions as the mobile positive ions. FIGS. 10A and 10B show SIMS signal intensity data, and FIG. 10C shows that data converted into atomic percent values.

Figure 11:
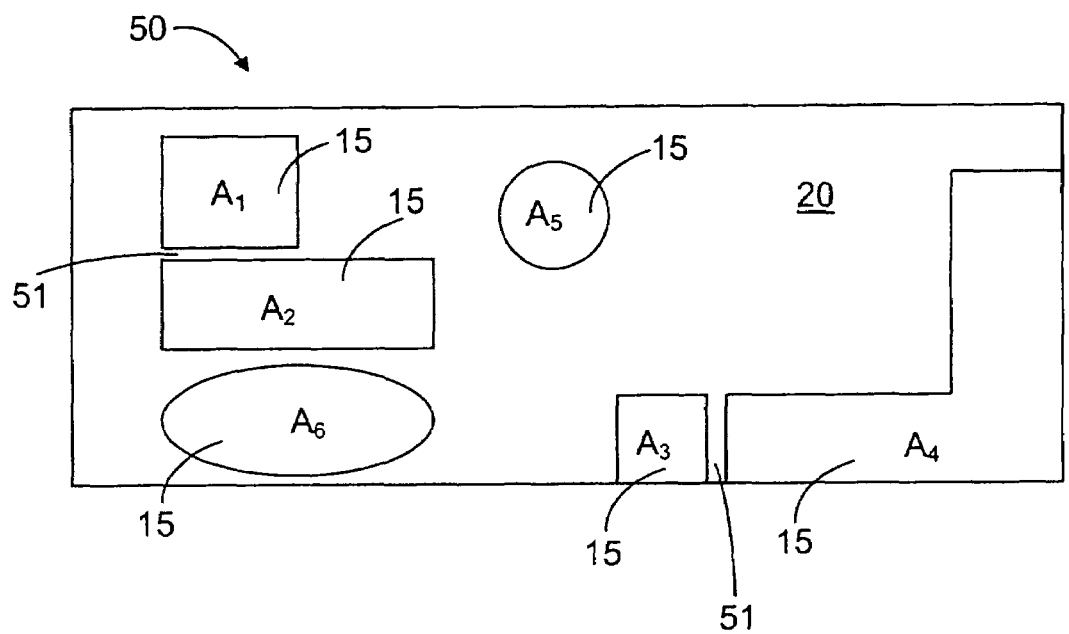

FIG. 11 is a schematic drawing illustrating an SOI structure which comprises multiple first layers on a single second layer.

Figure 12:
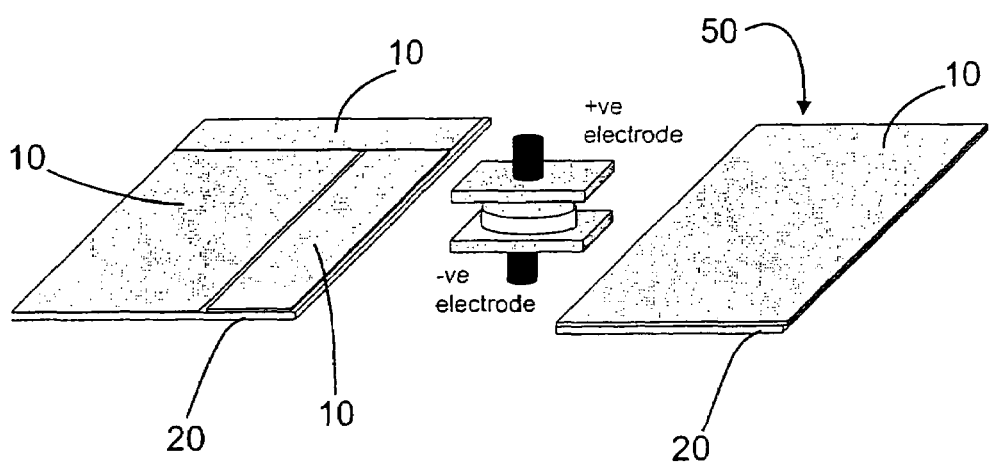

FIG. 12 is a schematic drawing illustrating a preferred process for producing the SOI structure of FIG. 11.

FIGS. 13A and 13B are schematic drawings illustrating preferred approaches for assembling multiple first substrates on a single second substrate. In particular, FIG. 13A shows machining of the edges of the first substrates to reduce the size of the gap between the substrates, and FIG. 13B shows the assembly of the first substrates on a conductive backer to, among other things, simplify repeated use of the first substrates.

FIG. 14 is a schematic drawing illustrating a multiple first substrate/single second substrate assembly where the gaps between first substrates have been filled with a semiconductor material.

Figure 15:
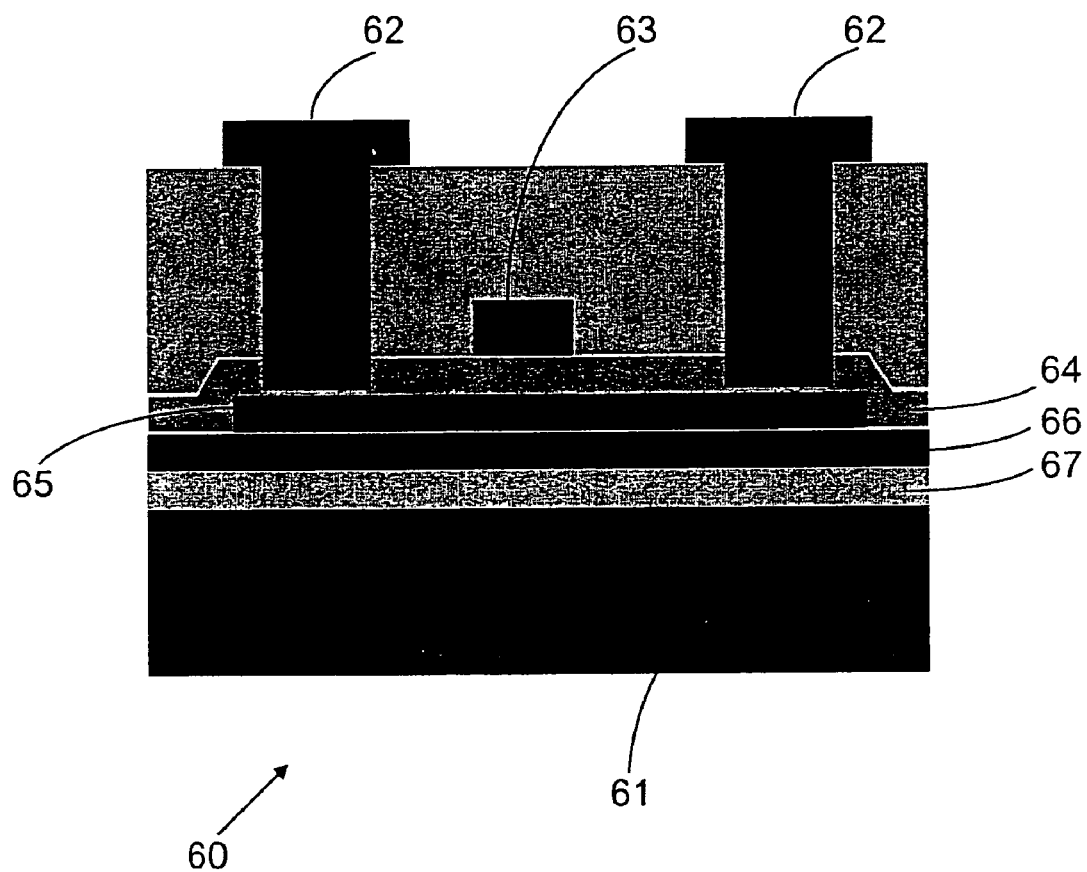

FIG. 15 is a schematic drawing illustrating a prior art process for forming a thin film transistor.

Figure 16:
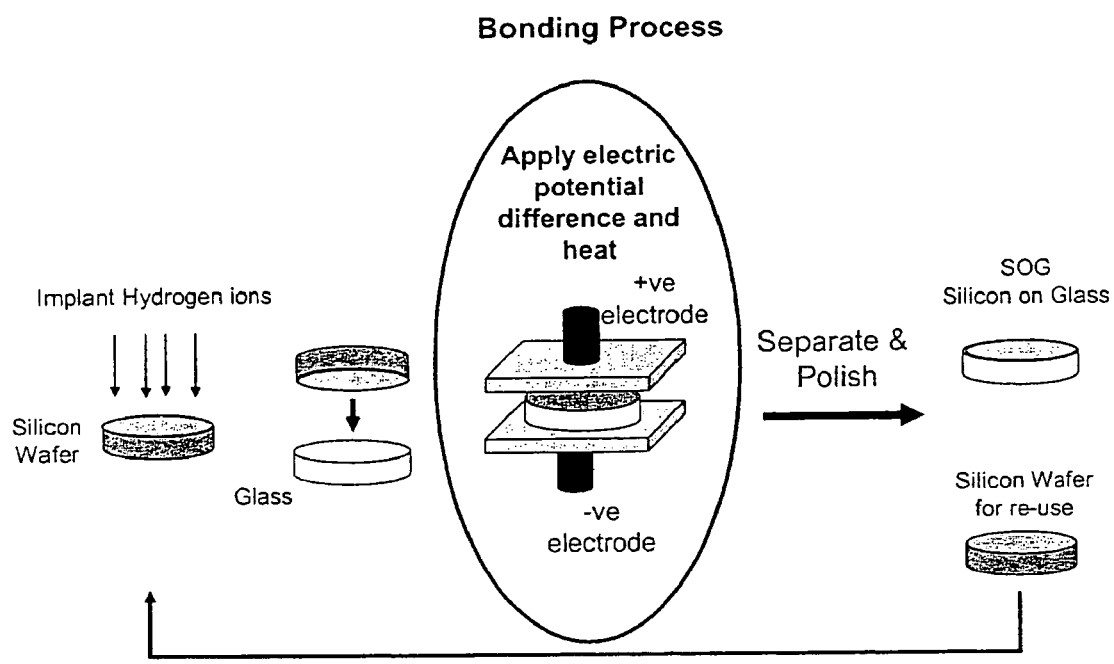

FIG. 16 is a schematic flow chart showing a preferred embodiment of the process aspects of the invention.

Figure 2A:
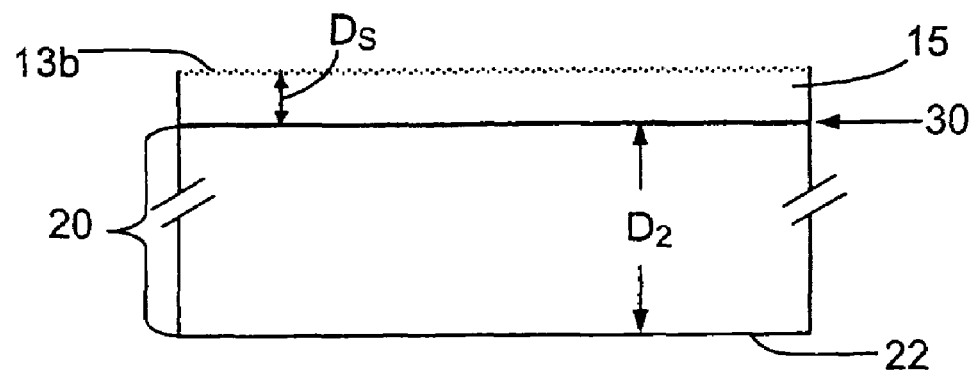
FIG. 2A shows a completed SOI structure after step (D).
Figure 17:
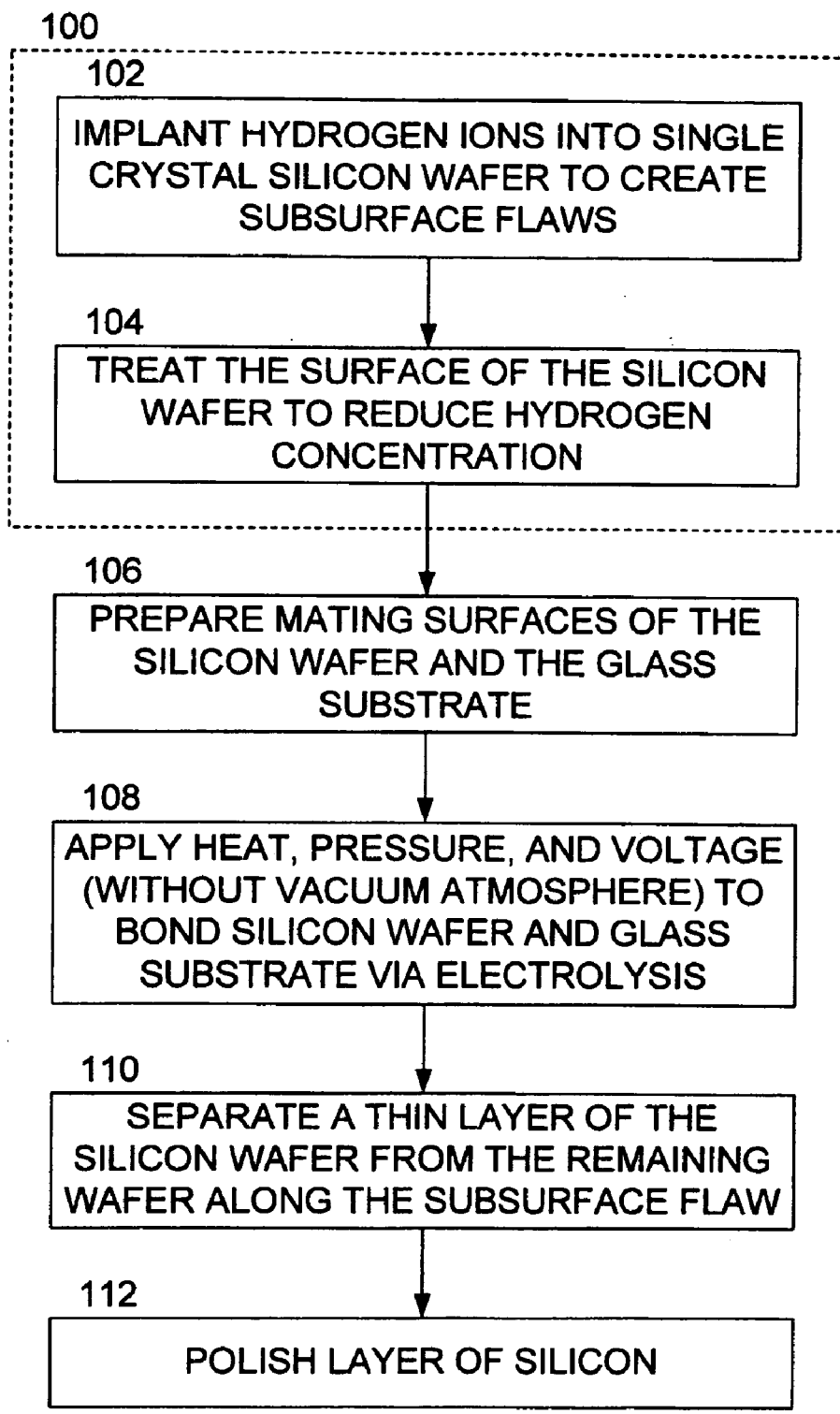

FIG. 17 is a flow diagram illustrating process steps that may be carried out to produce the SOI structure of FIG. 2A.

Figure 18:
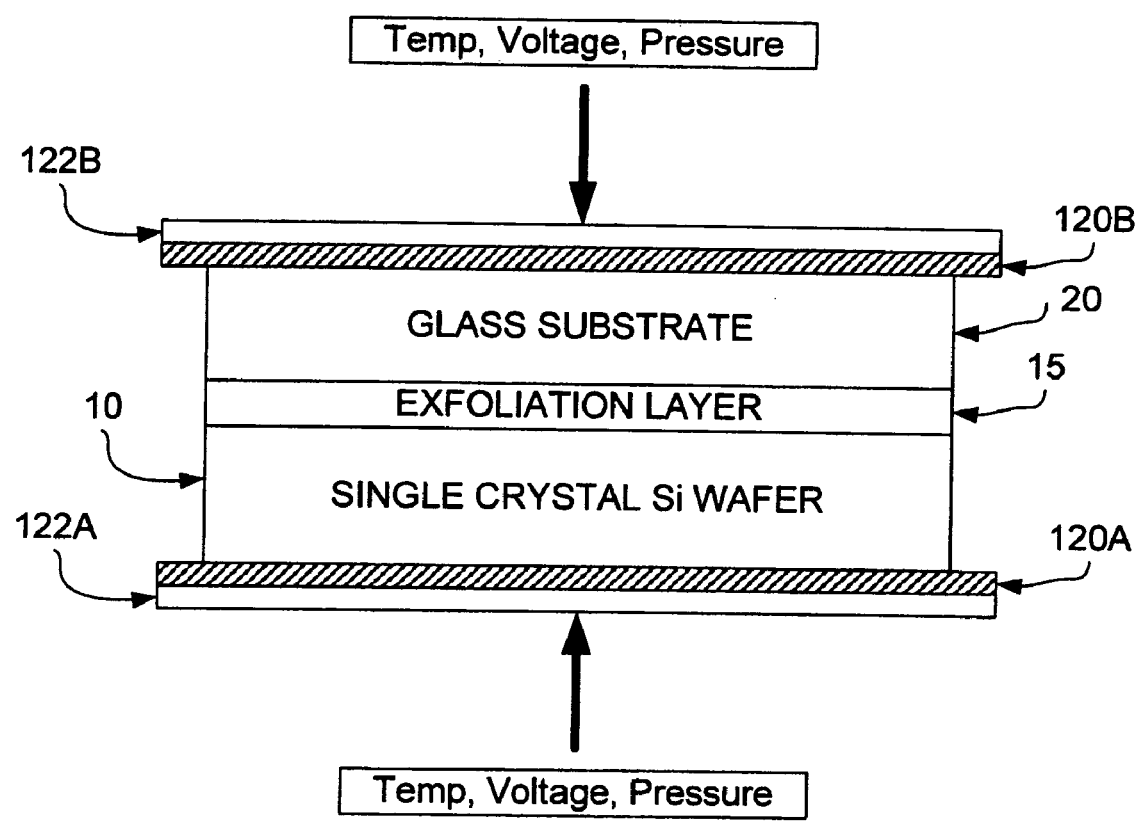

FIG. 18 is a schematic diagram of a system for bonding a semiconductor wafer to a glass substrate in accordance with one or more further aspects of the present invention.

Figure 19:
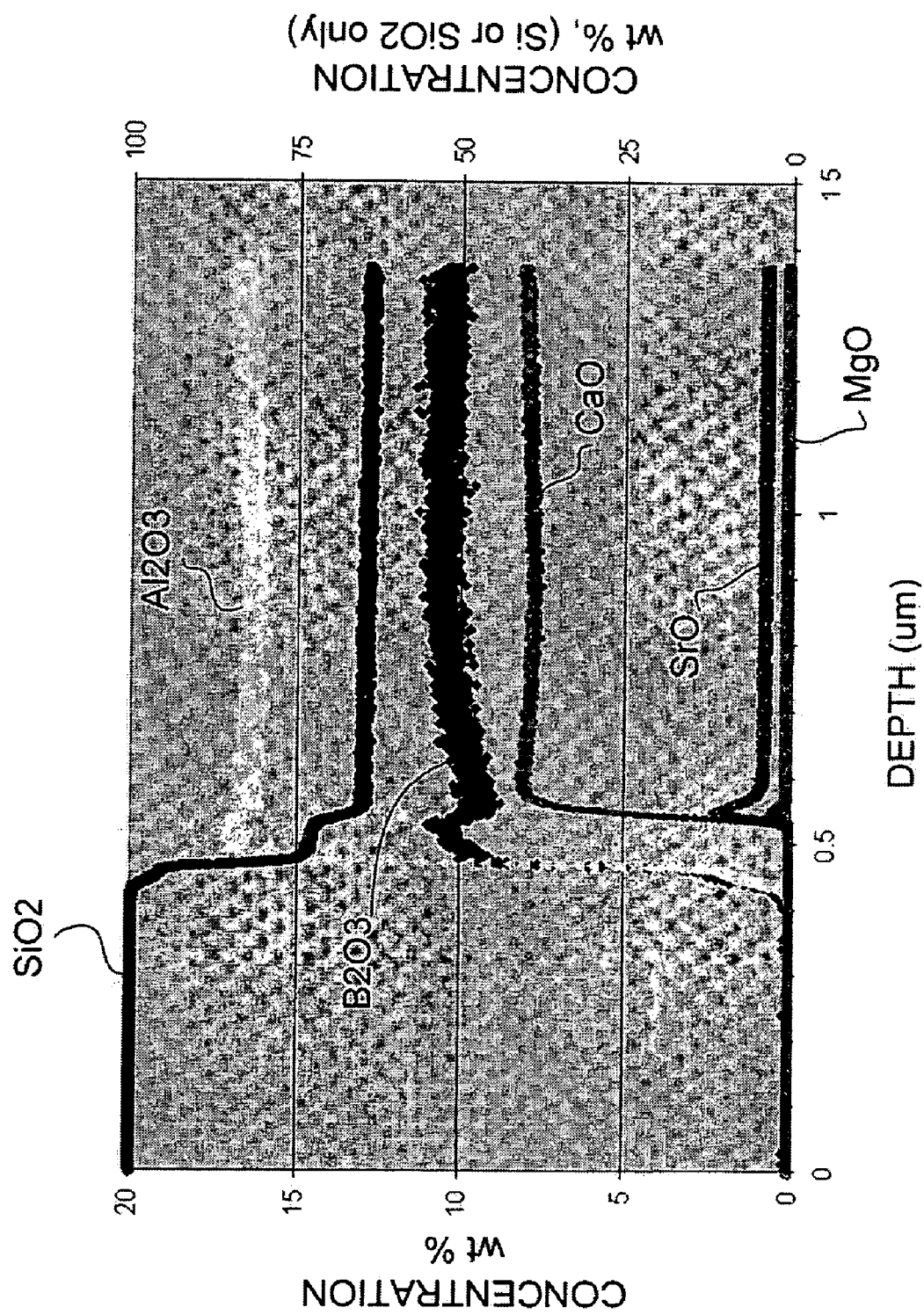

FIG. 19 is a graph illustrating bonding characteristics associated with a silicon on glass process in accordance with one or more embodiments of the present invention.

In the above drawings, like reference numbers designate like or corresponding parts throughout the several views. The elements to which the reference numbers generally correspond are set forth in Table 1.

DETAILED DESCRIPTION OF THE INVENTION

As discussed above, a major challenge of using inexpensive materials as a support substrate and, in particular, in using glass-based materials, specifically, oxide glasses and oxide glass-ceramics, as a support substrate, is that the 1100° C. bonding treatment previously used in the art cannot be used with glass-based wafers since most glasses cannot withstand process temperatures of this magnitude. The covalent bonding between the glass-based layer and the semiconductor material, e.g., silicon, thus has to be achieved at significantly lower temperatures. The requirement for lower temperatures also makes it challenging to separate the semiconductor wafer into parts at a separation zone formed by, for example, hydrogen ion implantation.

Moreover, when a glass-based material is substituted for silicon as a support substrate material, the expansion of the glass-based material should be matched to the expansion of the semiconductor layer of the SOI structure to avoid separation of the semiconductor layer from the support substrate. Although some glass-based materials with expansions close to that of semiconductors, e.g., silicon, are known, an exact match is difficult to obtain. Expansion mismatches are especially troublesome for large wafers where the stresses can become sufficiently high so as to cause debonding of the semiconductor layer.

A further requirement is that the interface between the glass-based substrate and the semiconductor material should be free of ions, such as alkali ions, which can diffuse into semiconductor structures and cause serious problems with the functioning of semiconductor devices. The glass-based materials known to have reasonably matched expansions to semiconductor materials, e.g., silicon, often contain alkali ions.

Thus, multiple problems need to be addressed and overcome to provide SOI structures which employ support substrates composed of glass-based materials. As summarized above, the present invention provides methods for producing SOI structures which address and overcome these problems. FIGS. 1A, 1B, 1C, and 1D schematically illustrate the process.

Figure 1A:
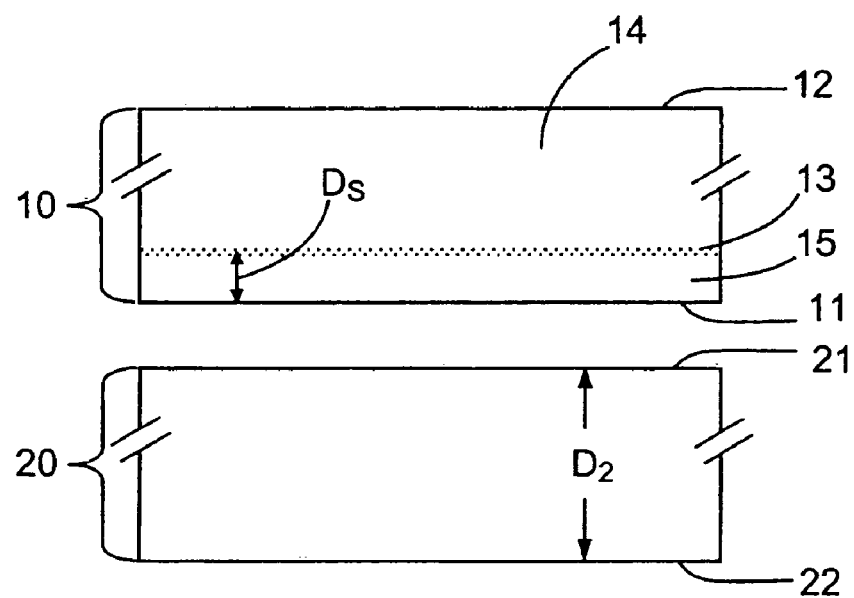
FIG. 1A is a schematic drawing illustrating step (A) of the invention's method for producing SOI structures.

Thus, FIG. 1A shows a first substrate 10 which comprises a substantially single-crystal semiconductor material. The semiconductor material can be a silicon-based semiconductor or any other type of semiconductor, such as, the III-V, II-IV, II-IV-V, etc. classes of semiconductors.

Examples of silicon-based materials which can be used for the first substrate include silicon (Si), germanium-doped silicon (SiGe), and silicon carbide (SiC) materials. Examples of other semiconductors which can be employed for the first substrate include Ge, GaAs, GaP, and InP materials.

The semiconductor of the first substrate will be in the form of a substantially single-crystal material. The word "substantially" is used in describing the first substrate to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

As shown in FIG. 1A, the first substrate 10 has a first external surface 11, a second external surface 12, and an internal zone 13 for separating the first substrate into a first part 14 and a second part 15, the thickness of the second part being $D_S$. As discussed above, $D_S$ will typically be in the range of 10 nanometers to 500 nanometers, with preferred thicknesses being in the 10 nanometer to 150 nanometer range. If desired, the second part can be thicker than 500 nanometers, e.g., on the order of a 1,000 nanometers or more. Similarly, the second part can be thinner than 10 nanometers, although excessively thin semiconductor layers will generally not provide sufficient material for the production of semiconductor devices. Thinner semiconductor layers may be created via oxidation or other methods known in the art.

External surfaces 11 and 12 and separation zone 13 preferably are parallel to one another. However, to take account of the fact that there may be some slight angle, e.g., up to 1-2 degrees, between one or more of the surfaces and/or the zone, the surfaces and zone are described herein as being "substantially parallel" which includes both the completely parallel and slightly angled cases. The phrase "substantially parallel" also includes the possibility that one or more of the surfaces or the zone may not be completely flat.

Separation zone 13 is formed using implantation/exfoliation techniques of the type currently known to those skilled in the art or which may be developed in the future. At present, the separation zone is preferably formed using the hydrogen ion implantation techniques of the references discussed above, the relevant portions of which are hereby incorporated by reference. Other currently-known techniques can also be used to form the separation zone, such as, co-implantation of hydrogen and helium ions or hydrogen and boron ions. Whatever technique is chosen, the first substrate needs to be separable into the first and second parts at the separation zone during step (D). Thus, the separation zone needs to respond to the heat treatment/cooling process by becoming weaker so that the division of the first substrate into the first and second parts can occur.

As also shown in FIG. 1A, the second substrate 20 comprises two external surfaces 21 and 22 which, like the surfaces and separation zone of the first substrate, are substantially parallel to one another. In order to ensure that the SOI structure has uniform properties in, for example, the radial direction for a circular wafer, e.g., uniform bonding strength at the interface between the first and second substrates, any deviations from parallel of external surfaces 11, 12, 21, and 22 and separation zone 13 are preferably kept to a minimum.

The second substrate comprises an oxide glass or an oxide glass-ceramic; although not required, the embodiments described herein include an oxide glass or glass-ceramic exhibiting a strain point of less than 1,000° C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses are presently preferred because they are typically simpler to manufacture, thus making them more widely available and less expensive.

As shown in FIG. 1A, the second substrate has a thickness $D_2$, which is preferably in the range of 0.1 mm to 10 mm and most preferably in the range of 0.5 mm to 1 mm. For some applications of SOI structures, insulating layers having a thickness greater than or equal to 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than 1 micron is readily achieved by simply using a second substrate whose thickness is greater than or equal to 1 micron. A preferred lower limit on the thickness of the second substrate is thus 1 micron.

In general terms, the second substrate needs to be thick enough to support the first substrate through the process steps of the invention, as well as subsequent processing performed on the SOI structure. Although there is no theoretical upper limit on the thickness of the second substrate, a thickness beyond that needed for the support function or that desired for the ultimate SOI structure is generally not preferred since the greater the thickness of the second substrate, the lower the electric field strength within the substrate during step (C) for the same applied voltage difference.

The oxide glass or oxide glass-ceramic is preferably silica-based. Thus, the mole percent of $SiO_2$ in the oxide glass or oxide glass-ceramic is preferably greater than 30 moles and most preferably greater than 40 mole %. In the case of glass-ceramics, the crystalline phase can be mullite, cordierite, anorthite, spinel, or other crystalline phases known in the art for glass-ceramics. The glass phase of the glass-ceramic should be sufficient to allow movement of positive ions away from the interface between the first and second substrates during step (C).

Non-silica-based glasses and glass-ceramics can be used in the practice of the invention, but are generally less preferred because of their higher cost and/or inferior performance characteristics. Similarly, for some applications, e.g., for SOI structures employing semiconductor materials that are not silicon-based, second substrates which are not oxide based, e.g., non-oxide glasses, may be desirable, but are generally not preferred because of their higher cost.

For certain applications, e.g., display applications, the glass or glass-ceramic is preferably transparent in the visible, near UV, and/or IR wavelength ranges, e.g., the glass or glass ceramic is preferably transparent in the 350 nm to 2 micron wavelength range.

The glass or glass-ceramic of the second substrate can be produced from conventional raw materials using a variety of techniques known in the glass making art.

The oxide glass or oxide glass-ceramic comprises at least some positive ions which during step (C), move within substrate 20 in the direction of the applied electric field, i.e., away from surface 21 and towards surface 22. Alkali ions, e.g., $Li^+$, $Na^{+1}$, and/or $K^{+1}$ ions, are suitable positive ions for this purpose because they generally have higher mobilities than other types of positive ions typically incorporated in oxide glasses and oxide glass-ceramics, e.g., alkaline-earth ions. However, oxide glasses and oxide glass-ceramics having positive ions other than alkali ions, e.g., oxide glasses and oxide glass-ceramics having only alkaline-earth ions, can be used in the practice of the invention.

The concentration of the alkali and alkaline-earth ions can vary over a wide range, representative concentrations being between 0.1 and 40 wt. % on an oxide basis. Preferred alkali and alkaline-earth ion concentrations are 0.1 to 10 wt. % on an oxide basis in the case of alkali ions, and 0-25 wt. % on an oxide basis in the case of alkaline-earth ions.

Although second substrates composed of a single glass or glass-ceramic are preferred, laminated structures can be used if desired. When laminated structures are used, the layer of the laminate closest to the first substrate should have the properties discussed herein for a second substrate composed of a single glass or glass-ceramic. Layers farther from the first substrate preferably also have those properties, but may have relaxed properties because they do not directly interact with the first substrate. In the latter case, the second substrate is considered to have ended when the properties specified for a second substrate are no longer satisfied.

Along these same lines, either or both of substrates 10 and 20 can include surface layers over part or all of their external surfaces, e.g., an oxide layer on the semiconductor. When present on surface 11 of substrate 10 and/or surface 21 of substrate 20, such surface layers should not have a composition and/or a thickness which will prevent the formation of a strong bond between the first and second substrates. In particular, an oxide layer on the semiconductor substrate having a thickness greater than about 100 nanometers can lead to weak or no bonding with the glass or glass-ceramic substrate.

Although not wishing to be bound by any particular theory of operation, it is believed that an oxide layer having a greater thickness provides a high resistance to current flow and thus diminishes the electrolysis-type reaction at the interface between the first and second substrates which is believed to produce the desired strong bond. Accordingly, when an oxide layer is present on the bonding surface of the first substrate, it should function primarily as a passivation layer, as opposed to an insulating layer. Likewise, any oxide layer formed on the bonding surface of the second substrate should not interfere with current flow and thus will typically (and preferably) have a thickness of less than about 100 nanometers. When surface layers are present on the bonding surfaces of substrates 10 and/or 20, they constitute intermediate layers between the first and second substrates in the finished SOI structure.

For certain first substrate/second substrate combinations, pretreatment of the bonding surface 11 of first substrate 10 to reduce its hydrogen concentration has been found advantageous in achieving bonding of the second part 15 of the first substrate to second substrate 20. In particular, such a reduction in hydrogen concentration has been found to be of particular importance when transferring silicon films from silicon wafers implanted with hydrogen ions to glass substrates containing alkaline-earth ions, such as, substrates made of CORNING INCORPORATED GLASS COMPOSITION NO. 1737 or CORNING INCORPORATED GLASS COMPOSITION NO. EAGLE 2000™, which are used in, for example, the production of liquid crystal displays. It is believed that a reduction in hydrogen concentration will also be advantageous for glass and glass ceramics having high strain points, e.g., in the 850° C. to 900° C. range, which are expected to be needed for RF applications in wireless and other electronics applications.

In particular, it has been found that after hydrogen ion implantation, the surface of an implanted silicon wafer has a high hydrogen concentration, e.g., a high hydrogen ion concentration. The hydrogen termination at the Si surface inhibits the bonding process and thus it has been found desirable to reduce the hydrogen concentration on the implanted Si wafer surface by using a gentle oxidizing treatment in order to obtain effective Si layer transfer to glass wafers of the foregoing types. Reduction in hydrogen concentration results in making the implanted silicon wafer more hydrophilic and allows the bonding to take place during the application of voltage and heat. The strong bond formed during the process allows uniform separation of the Si film from the mother wafer.

Quantitatively, it has been found that in the absence of a hydrogen reduction treatment, only about 10% of the glass wafer is covered with a Si film and even in the covered area, the Si film tends to be non-uniform. However, when the hydrogen concentration at the surface of the Si is reduced by an oxidizing treatment, a uniform Si film becomes attached to the glass wafer over its entire surface.

Various approaches can be used to reduce the hydrogen concentration on the surface of an implanted wafer. Preferred approaches involve a mild oxidation treatment of the surface, such as, treatment of the wafer with an oxygen plasma, treatment with hydrogen peroxide, hydrogen peroxide and ammonia, hydrogen peroxide and ammonia followed by hydrogen peroxide and an acid, or combinations of these processes. Treatment with an oxygen plasma is the preferred approach, especially in a commercial setting. Although not wishing to be bound by any particular theory of operation, it is believed that during these treatments, hydrogen terminated surface groups oxidize to hydroxyl groups, which in turn makes the surface of the silicon wafer hydrophilic. The treatment is preferably carried out at room temperature for the oxygen plasma and at a temperature between 25-100° C. for the ammonia+peroxide or ammonia+peroxide followed by acid+ peroxide treatments.

Although the foregoing discussion has been in terms of silicon wafers, it is believed that reductions in hydrogen concentration will be advantageous for hydrogen-implanted semiconductor wafers composed of semiconductor materials other than silicon.

Figure 1B:
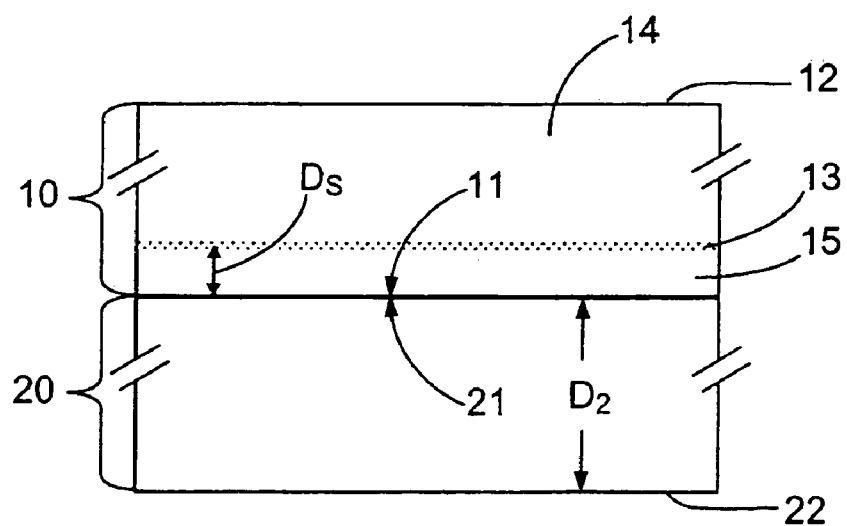
FIG. 1B is a schematic drawing illustrating step (B) of the invention's method for producing SOI structures.

Turning to FIG. 1B, this figure illustrates step (B) of the process of the invention in which the first and second substrates 10 and 20 are brought into contact at their bonding surfaces 11 and 21. In the preferred embodiments of the invention, the first and second substrates are heated prior to step (B), e.g., are heated so that force-applying surfaces 12 and 22 are at $T_1$ and $T_2$, respectively. In this way, differential expansion between the first and second substrates is avoided during the bonding process of step (C). Alternatively, the first and second substrates are not pre-heated prior to step (B), but are heated after bonding surfaces 11 and 21 have been brought into contact and before the beginning of step (C) and/or during the initial part of step (C) before substantial bonding has occurred. When pre-heating is performed, the bonding surfaces can be separated by spacers which are removed once the desired temperatures of the first and second substrates have been reached.

Figure 1C:
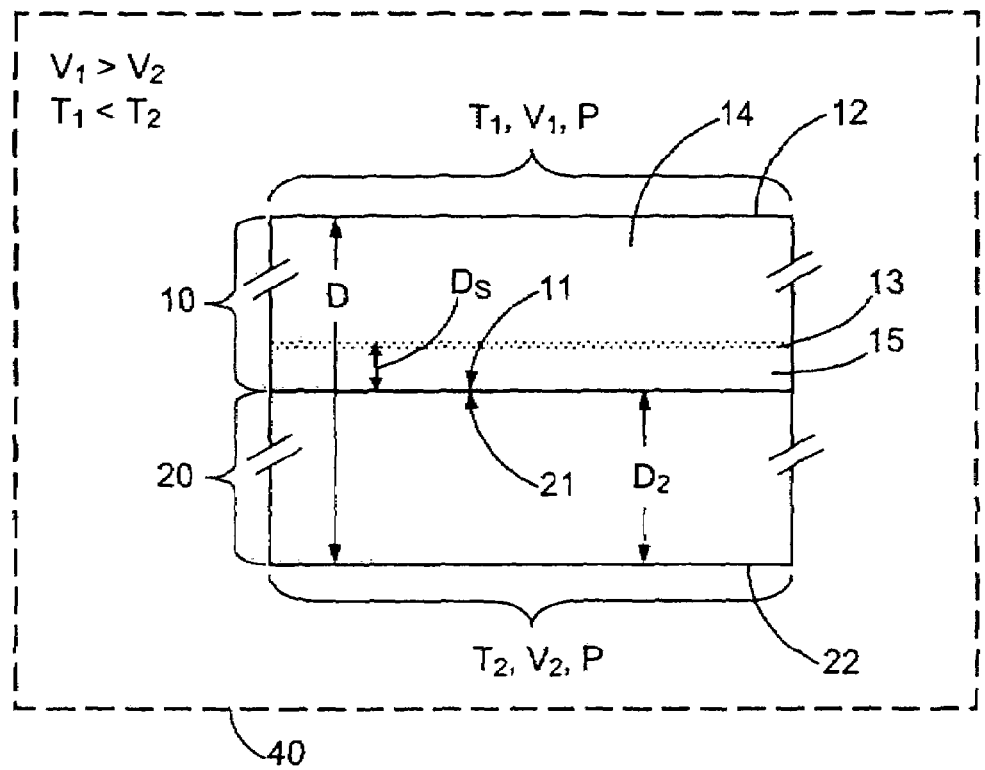
FIG. 1C is a schematic drawing illustrating step (C) of the invention's method for producing SOI structures. As shown in this figure, $T_2$ is preferably greater than $T_1$.

The processing chamber, which is shown schematically at 40 in FIG. 1C, can have a variety of configurations. For experimental purposes, a bonder of the type sold by SÜSS MICROTEC of Munich, Germany, can be used as the processing chamber. The same equipment can be used for commercial applications, although equipment capable of simultaneously processing multiple first substrate/second substrate assemblies will generally be preferred.

Because the invention uses low to moderate temperatures, pressures, electric field strengths, and vacuum levels, the requirements which the processing chamber needs to satisfy are not demanding, which is another important advantage of the invention, i.e., the invention can be practiced with equipment which is both relatively inexpensive and widely available or easily fabricated for custom applications.

FIG. 1C shows the central step of the process, i.e., step (C), where the first and second substrates are bonded to one another. Step (C) is performed for a period of time sufficient for the first and second substrates to bond to one another at the first and second bonding surfaces. For example, step (C) can be performed for a period between 45 and 90 minutes. Shorter periods of time are, of course, generally preferred (e.g., times less than 30 minutes) and in a commercial setting, it is expected that the time required to perform step (C) can be reduced to a period of 5-15 minutes or less through the optimization of substrate materials, processing temperatures, and applied voltages.

Step (C) is preferably performed under moderate vacuum conditions, i.e., chamber 40 is evacuated while step (C) is performed. Preferably, the pressure in the chamber is less than or equal to 1 millibar, and most preferably, less than or equal to $10^{-3}$ millibars. Alternatively, step (C) can be performed in an inert atmosphere, such as, an atmosphere of argon, helium, or the like.

As discussed above and shown in FIG. 1C, step (C) is performed with $V_1 > V_2$ and preferably with $T_1 < T_2$, where $V_1$ and $T_1$ are, respectively, the voltage and temperature at force-applying surface 12, and $V_2$ and $T_2$ are, respectively, the voltage and temperature at force-applying surface 22. In the examples described below, the second substrate was located below the first substrate as shown in FIG. 1C, although the opposite orientation can be used if desired. Also, vertical or other orientations for the substrates can be used, if desired.

$V_1$ and $V_2$ preferably satisfy the relationship:

$$100 \text{ volts/cm} \leq (V_1 - V_2)/D \leq 40 \text{ kilovolts/cm},$$

where D is the distance between the first and second force-applying surfaces during step (C). A preferred value for the $(V_1-V_2)/D$ ratio ranges between about 5-20 KV/cm.

$T_1$ and $T_2$ preferably satisfy the relationships:

$$T_s - 350 \leq T_1 \leq T_s + 350; \text{ and}$$

$$T_s - 350 \leq T_2 \leq T_s + 350,$$

where $T_s$ is the strain point of the oxide glass or oxide glass-ceramic and $T_s$, $T_1$, and $T_2$ are in degrees centigrade. As discussed above, $T_s$ is less than 1000° C., can be less than 800° C., and may also be less than about 700° C.

Typically, both $T_1$ and $T_2$ will be greater than or equal to 300° C. and less than or equal to 800° C., although higher or lower temperatures can be used, if desired. Within this range, lower temperatures are generally preferred, e.g., temperatures of around 450° C. for glasses like CORNING INCORPORATED GLASS COMPOSITIONS NOS. 7070 and 7740 used in various examples presented below.

In addition to their role in achieving bonding of the first and second substrates, as discussed above, $T_1$ and $T_2$ are chosen to provide differential contraction of the first and second substrates upon cooling so that in the preferred embodiments of the invention, the second substrate 20 seeks to contract to a greater extent than the first substrate 10 to thereby weaken the first substrate at separation zone 13 and produce an SOI structure where the semiconductor film is under compression, as opposed to tension. Typically and preferably, $T_2$ will be greater than $T_1$, with $T_1$ and $T_2$ generally satisfying the relationship:

$$5° C. \leq T_2 - T_1 \leq 150° C.,$$

and preferably the relationship:

$$10° C. \leq T_2 - T_1 \leq 150° C.$$

Moreover, the coefficients of thermal expansion of the first and second substrates and the chosen temperature differential will preferably satisfy at least one and most preferably both of the following relationships:

$$CTE_1 - 20 \times 10^{-7}/° C. \leq CTE_2 \leq CTE_1 + 20 \times 10^{-7}/° C.;$$
and/or $$(T_2 - T_1) \cdot |CTE_2 - CTE_1| \leq 30 \times 10^{-5}, T_2 > T_1;$$

where $CTE_1$ is the 0° C. coefficient of thermal expansion of the substantially single-crystal semiconductor material and $CTE_2$ is the 0-300° C. coefficient of thermal expansion of the oxide glass or oxide glass-ceramic. In applying these relationships, the 0-300° C. CTE of the oxide glass or oxide glass-ceramic (i.e., $CTE_2$) preferably satisfies the relationship:

$$5 \times 10^{-7}/° C. \leq CTE_2 \leq 75 \times 10^{-7}/° C.$$

Figure 2B:
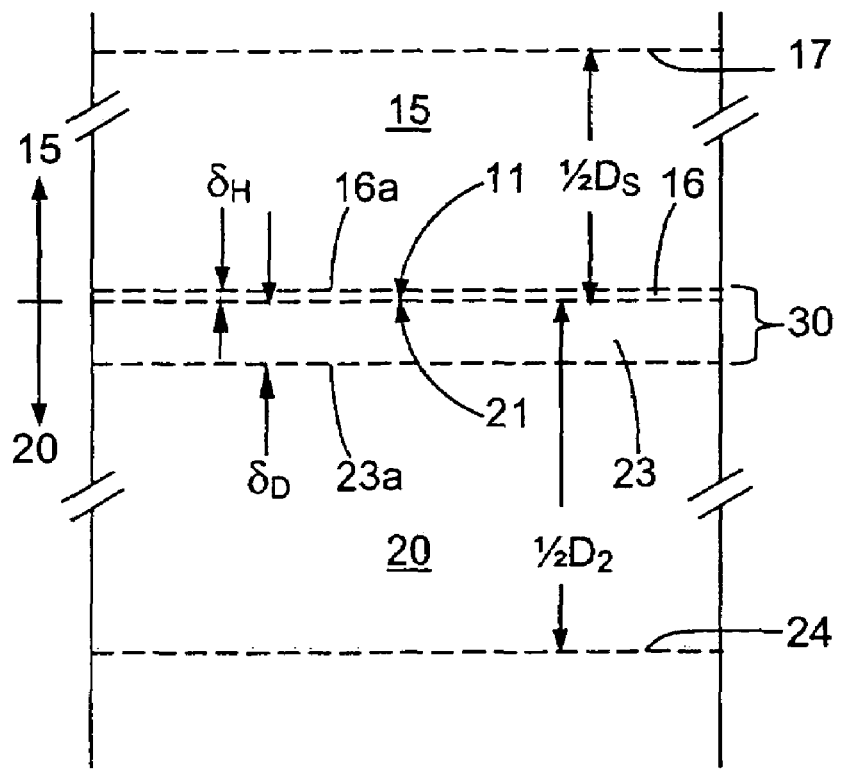
FIG. 2B is a schematic drawing illustrating at an expanded scale the interface region 30 between the first and second substrates produced by step (C). As indicated in this figure, reference surfaces 17 and 24 are at $½D_s$ and $½D_2$ of FIG. 2A, respectively.

As discussed above, during step (C), positive ions within the second substrate (e.g., $Li^{+1}$, $Na^{+1}$, $K^{+1}$, $Cs^{+1}$, $Mg^{+2}$, $Ca^{+2}$, $Sr^{+2}$, and/or $Ba^{+2}$ ions (the alkali/alkaline-earth ions)) can move away from the interface between the first and second substrates to form a depletion region, shown schematically in FIG. 2B by the reference number 23. The thickness $\delta_D$ of this region can be defined in terms of reference concentrations for the positive ions.

Considering specifically the case of alkali/alkaline-earth ions, each of those ions which the oxide glass or oxide glass-ceramic contains will have a reference concentration $C_{i/Ref}$ at a reference surface 24 which 1) is within the second substrate, 2) is substantially parallel to the second bonding surface 21, and 3) is spaced from that surface by a distance $D_2/2$. The thickness $\delta_D$ of the positive ion depletion region can then be defined as the distance between the second bonding surface 21 and a surface 23a which 1) is within the second substrate, 2) is substantially parallel to the second bonding surface, and 3) is the surface farthest from the second bonding surface for which the following relationship is satisfied for at least one of the alkali/alkaline-earth ions which the oxide glass or oxide glass-ceramic contains:

$$C_i(x)/C_{i/Ref} \leq 0.5, 0 \leq x \leq \delta_D,$$

where $C_i(x)$ is the concentration of said at least one alkali/alkaline-earth ion as a function of distance x from the second bonding surface, and $C_i(x)$ and $C_{i/Ref}$ are in atomic percent.

Using this definition, $\delta_D$ will generally satisfy the relationship:

$$\delta_D \geq 10 \text{ nanometers},$$

and will often satisfy the relationship:

$$\delta_D \geq 1000 \text{ nanometers}.$$

As discussed above, the movement of the positive ions within the second substrate during step (C) also can produce one or more "pile-up" regions for one or more of the mobile positive ions contained in the oxide glass or oxide glass-ceramic. Such pile-up regions, when present, can have a thickness of 500 nanometers or more and a peak positive ion concentration $C_{i/peak}$ which satisfies the relationship:

$$C_{i/peak}/C_{i/Ref} \geq 1.$$

where $C_{i/peak}$ and $C_{i/Ref}$ are in atomic percent, and $C_{i/Ref}$ is defined as set forth above. In some cases, $C_{i/peak}/C_{i/Ref}$ will be greater than 2 (see, for example, the $K^+$ pile-up region of FIG. 5B below).

The one or more pile-up regions, when present, are located in the vicinity of $x = \delta_D$, i.e., they can overlap $\delta_D$ or can be just inside or just outside of $\delta_D$. In particular, the location $x_{peak}$ of the peak of a pile-up region typically satisfies the relationship:

$$0.8 \cdot \delta_D \leq x_{peak} \leq 1.2 \cdot \delta_D,$$

and often satisfies the relationship:

$$0.9 \cdot \delta_D \leq x_{peak} \leq 1.1 \cdot \delta_D,$$

where $x_{peak}$ is the distance of the peak from the second bonding surface and $\delta_D$ is as defined above.

In the case of oxide glasses containing alkaline-earth ions, it has been found that by reducing the processing temperature, time, and/or voltage employed in step (C), some bonding of a silicon film to a glass wafer can be achieved with essentially no observable ion movement. However, this bonding is of the mechanical type, e.g., van der Waals type bonding, as opposed to chemical bonding, and the resulting bond strengths are lower than those achieved with ion movement. Also, because it lacks a depletion region, the resulting structure can suffer from ion movement into the silicon film during subsequent processing of the SOI structure at elevated temperatures, which can impair the functioning of electronic devices formed on or in the silicon film. Accordingly, in the preferred embodiments of the invention, the process is performed so that a depletion region is formed at the interface between the first and second substrates.

In addition to the depletion region and the one or more pile-up regions, step (C) can also produce a hybrid region 16 of enhanced oxygen concentration which begins at surface 11 and extends towards separation zone 13. The thickness $\delta_H$ of this region can be defined in terms of a reference concentration for oxygen at a reference surface within the substantially single-crystal semiconductor material.

A suitable reference surface is, for example, surface 17 in FIG. 2B which: 1) is within the second part of the first substrate, 2) is substantially parallel to bonding surface 11, and 3) is separated from that surface by a distance $D_S/2$, where, as above, $D_S$ is the thickness of the second part. Using this reference surface, the thickness $\delta_H$ of the hybrid region will typically satisfy the relationship:

$$\delta_H \leq 200 \text{ nanometers},$$

where $\delta_H$ is the distance between bonding surface 11 and a surface which 1) is within the second part of the first substrate, 2) is substantially parallel to bonding surface 11, and 3) is the surface farthest from bonding surface 11 for which the following relationship is satisfied:

$$C_o(x) - C_{o/Ref} \geq 50 \text{ percent}, 0 \leq x \leq \delta_H,$$

where $C_o(x)$ is the concentration of oxygen as a function of distance x from bonding surface 11, $C_o/Ref$ is the concentration of oxygen at the above reference surface, and $C_o(x)$ and $C_o/Ref$ are in atomic percent.

Typically, $\delta_H$ will be substantially smaller than 200 nanometers, e.g., on the order of 50-100 nanometers. It should be noted that $C_o$/Ref will typically be zero, so that the above relationship will in most cases reduce to:

$$C_o(x) \geq 50 \text{ percent}, 0 \leq x \leq \delta_H.$$

In the case of a first substrate which is silicon based and a second substrate which is a silica-based glass or glass-ceramic containing one or more other oxides, e.g., such network formers as $B_2O_3$, $Al_2O_3$, and/or $P_2O_5$, the hybrid region can be characterized as a region which contains silicon oxide, e.g., silica ($SiO_2$), but does not contain the one or more other oxides of the silica-based glass or glass-ceramic.

In summary, step (C) transforms the interface between the first and second substrates which is formed in step (B) by contacting bonding surface 11 with bonding surface 21, into an interface region 30, which preferably comprises hybrid region 16 and depletion region 23, and may also preferably comprise one or more positive ion pile-up regions in the vicinity of the distal edge of the depletion region.

Figure 1D:
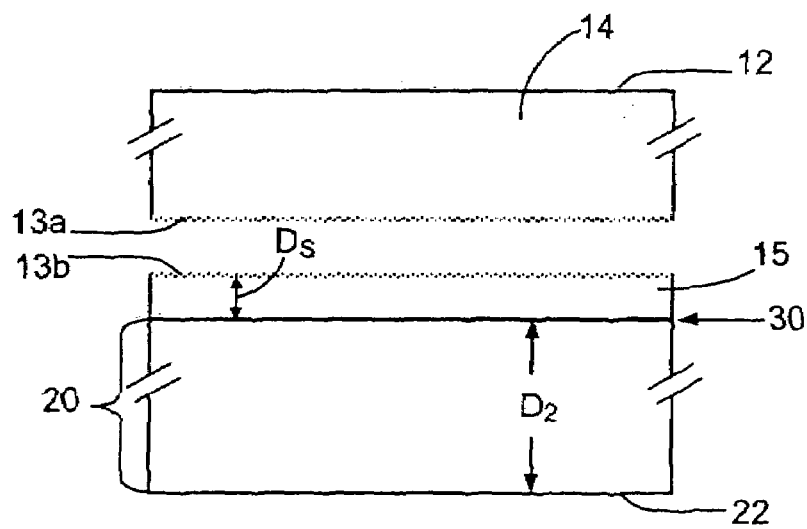
FIG. 1D is a schematic drawing illustrating step (D) of the invention's method for producing SOI structures.

After step (C), the bonded first and second substrates are cooled, e.g., to room temperature, and the first and second parts (14, 15) of the first substrate are separated from one another. Because of the weakening of the separation zone which occurs during cooling, this separation can be performed without disturbing the bond between the second part and the second substrate or damaging the second part or the second substrate. In many cases, the separation involves merely moving the first and second parts (14, 15) of the first substrate 10 away from one another (e.g., lifting the second part 14 upwards as shown in FIG. 1D), since during the cooling, those parts will have become completely free of one another. In some cases, a slight peeling action, like that used to remove household plastic wrap from a smooth object, is used at the end of the cooling to separate the two parts, but more than this is not needed because of the differential contraction of the first and second substrates and the resulting weakening of the separation zone.

As can be seen in FIG. 1D, the separation will typically result in part of separation zone 13 ending up associated with the first part of the first substrate and with part ending up associated with the second part (see 13a and 13b in FIG. 1D). Depending upon processing conditions and ultimate end use, the external surfaces of the first and second parts produced by this separation, i.e., the exfoliation surfaces, may be useable as is or may require subsequent treatments, e.g., polishing, etching, doping, etc., prior to use. For example, prior to reuse as a first substrate in another iteration of the overall process, the exfoliation surface of first part 14 may be subjected to conventional touch polishing to provide a sufficiently smooth surface for bonding to a new second substrate. Such polishing or other surface treatments may also be appropriate for the exfoliation surface of the second part 15 prior to its use in the manufacture of a thin film transistor or other electronic device.

Although generally not preferred, one can conceive of integrating step (D) into step (C) by, for example, partially cooling the first and second substrates and then applying a separating force, e.g., twisting the first and second substrates relative to one another, while continuing to subject the substrates to an elevated temperature, an electric field, and an applied pressure. Such separating can, for example, be begun part way through step (C). In a commercial setting, such integration of step (D) with step (C) may be desirable to shorten the overall process, especially if for a particular set of substrates and operating conditions, the bonding between the substrates becomes strong enough for separation of the first and second parts to be performed while additional step (C)-type processing is continued to develop a depletion zone of a desired thickness.

As noted above, once the first and second parts are separated, the resulting SOI structure, i.e., the second part and its attached second substrate, can be subjected to further processing as appropriate for the intended use of the structure. In particular, surface 13b can, for example, be treated to remove any roughness or other imperfections arising from the separation process. Similarly, first part 14 of the first substrate can be treated for subsequent use as, for example, a new (slightly thinner) first substrate.

Figure 3:
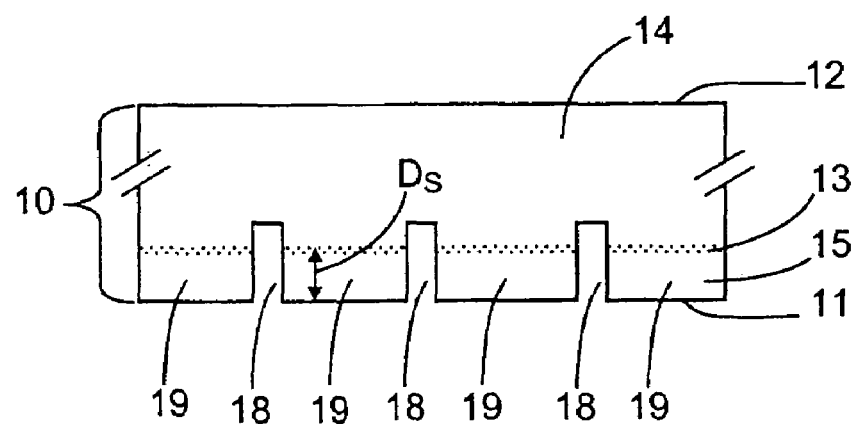
FIG. 3 is a schematic drawing illustrating the use of recesses in the bonding surface of the first substrate to create regions which can expand and contract in relative isolation from one another.
Figure 4:
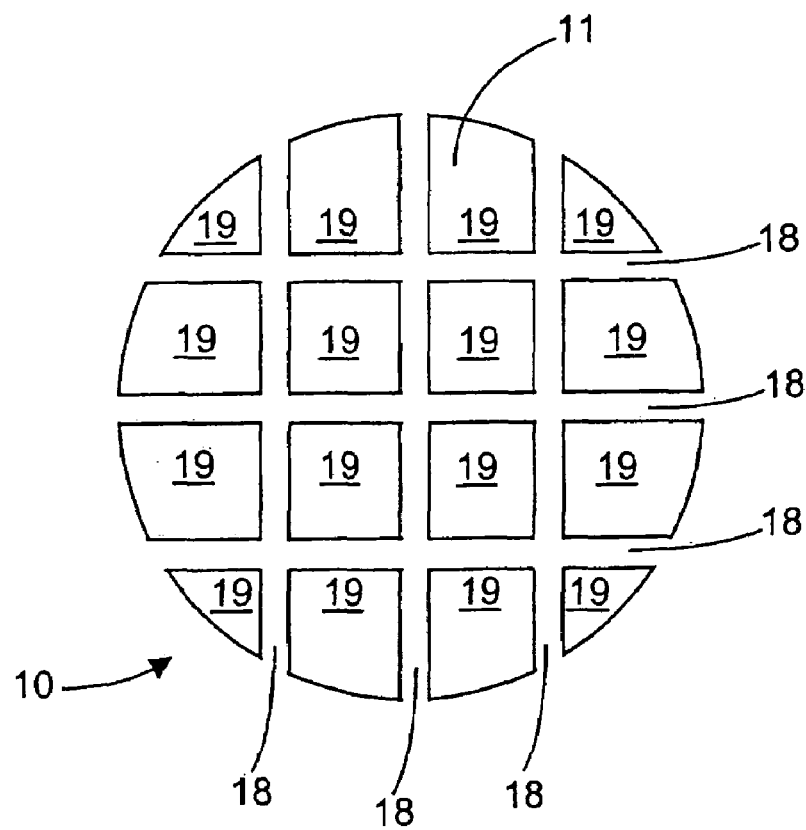
FIG. 4 is a plan view of the bonding surface of the first substrate illustrating the recesses and isolated regions of FIG. 3.

FIGS. 3 and 4 illustrate a modification of the first substrate which can be used if delamination (de-bonding) of the first and second substrates is a concern. Specifically, delamination can occur if there is a large difference in the coefficients of thermal expansion of the semiconductor material and the oxide glass or oxide glass-ceramic. It can also occur when SOI structures having large surface areas are produced.

As shown in FIGS. 3 and 4, to address this problem, recesses 18 can be formed in the first substrate which begin at bonding surface 11 and preferably extend into the first substrate to a distance greater than the depth of second part 15. These recesses form isolated regions 19 which can expand and contract relatively independently of one another. In this way, high stresses do not develop as a result of differences in the CTEs of the first and second substrates as those substrates, after bonding, cool from the operating temperature of step (C) e.g., 450° C. for glasses like CORNING INCORPORATED GLASS COMPOSITIONS NOS. 7070 and 7740 used in various of the examples presented below, to room temperature.

For many applications, the first substrate will be a silicon-based semiconductor material and the second substrate will be an alkali-containing glass. For this case, the process of the invention can be practiced as follows.

First, a glass containing a small percentage of alkali ions with expansion relatively well matched to that of silicon is chosen. A silicon wafer either without an oxide layer or with a thin oxide layer (see above) is implanted with hydrogen ions to generate subsurface flaws. The implanted wafer is then placed on the glass wafer with the implanted surface next to the glass wafer surface with spacers in between.

These two wafers are then placed in a chamber. The wafer assembly is then heated under a differential temperature gradient, with the glass wafer being heated to a higher temperature than the silicon wafer. The temperature difference between the wafers is at least 10° C., but may be as high as 100-150° C. This temperature differential is crucial for a glass having a CTE matched to that of silicon since it ensures separation of the Si film from the Si wafer due to thermal stresses. Without the application of the temperature gradient, the Si layer separation cannot be performed without damage to the SOI structure. Once the temperature differential between the wafers is stabilized, the spacers are removed and mechanical pressure is applied to the two-wafer assembly. The preferred pressure range is 1-50 psi. Application of higher pressures, e.g., pressures above 100 psi, typically causes breakage of the glass wafer.

A voltage is applied across the wafer assembly with the Si wafer at the positive electrode and the glass wafer at the negative electrode. The application of the potential difference causes the alkali ions to move away from the Si/glass interface into the glass wafer. This accomplishes two functions—an alkali free interface is created and the glass becomes very reactive and bonds to the Si wafer strongly with the application of heat at low temperatures.

After the assembly is held under these conditions for some time (e.g., approximately 1 hr), the voltage is removed and the wafer assembly is allowed to cool to room temperature. The Si wafer and the glass wafer are then separated, which may include some peeling if they have not already become completely free, to obtain a glass wafer with a thin film of Si, i.e., the desired glass SOI wafer.

As discussed above, in certain applications of the invention, multiple SOI structures can be formed on a single second layer. FIG. 11 shows a stylized configuration for such a multiple first layer/single second layer assembly 50, where $A_1$, $A_2$, . . . $A_6$ are representative first layer shapes and 51 are optional gaps between closely-spaced first layers. As discussed above, the portions of second layer 20 which are not associated with a first layer can be used for a variety of purposes, including as supports for amorphous and/or polycrystalline semiconductor materials.

FIG. 12 shows in schematic form the application of the process aspects of the invention to the production of multiple first layer/single second layer assemblies. As shown in the left hand part of the figure, implanted semiconductor pieces 10, e.g., hydrogen-implanted silicon pieces, of the desired shape and size are assembled on a glass or glass-ceramic substrate 20 in an initial assembly step (hereinafter referred to as "tiling," which includes the case of a single first substrate 10 which covers only part, rather than all, of a second substrate 20). The resulting assembly of multiple semiconductor (e.g., silicon) substrates and a single glass or glass ceramic substrate is then subjected to the application of heat and electric potential to bond the semiconductor to the glass or glass ceramic (see the middle part of FIG. 12). All the semiconductor pieces bond to the glass or glass ceramic although there may be no continuous electrical contact between the individual pieces. On completion of the bonding cycle, the semiconductor pieces and glass or glass ceramic with attached semiconductor film are separated to produce the desired SOI structure (see the right hand part of FIG. 12; this part of FIG. 12 also shows filled gaps between the semiconductor films (see below)).

The advantages of using a tiling process include the ability to provide large glass or glass ceramic substrates with substantially single crystal semiconductor films without a limitation on size. For display applications, the size of the glass substrate needed is often larger than the 300 mm diameter of semiconductor wafers. Similarly, photovoltaic applications also require large area SOI structures.

Tiling also allows substantially single crystal semiconductor materials to be placed on desired sites on glass or glass ceramic substrates. This ability allows placement of high performance semiconductor films, e.g., silicon films, in the areas of large substrates where drivers and memory circuits may be placed and thus avoids having to cover the entire substrate with a semiconductor film, thus reducing cost.

When multiple semiconductor substrates are tiled on a single glass or glass-ceramic substrate, the distance between the semiconductor films of the finished SOI structure depends on the proximity of the semiconductor substrates during initial assembly. The proximity may be controlled by finely machining the semiconductor pieces to precisely fit close together. FIG. 13A shows one way in which the edges of semiconductor wafers may be machined to minimize the gap between adjacent pieces.

FIG. 13B shows another way to perform the tiling operation in which pieces of one or more semiconductor wafers 10 are assembled in a desired pattern and then bonded to a conductive substrate 41 which acts as a support structure. The bonding can be done by soldering, brazing, or use of a refractory conductive glue. The support structure may be a metal foil or other conductive substrate which can withstand the process temperature. The semiconductor pieces on the conductive substrate are then implanted with, for example, hydrogen ions, and bonding to the glass or glass ceramic is carried out as described above. After separation of the semiconductor films from the bodies of the semiconductor pieces, the exposed exfoliation surfaces of the semiconductor pieces on the conductive substrate can be polished to remove surface roughness, and implanted again, whereupon, the bonding process with another glass or glass ceramic substrate can be repeated. In this way, the semiconductor pieces do not need to be reassembled each time an SOI structure is produced. Tiling using a conductive support is particularly useful when large area SOI structures are to be produced.

If desired, the small gaps between semiconductor pieces can be filled with semiconductor material after the pieces have been assembled on the conductive substrate using CVD or other deposition processes. FIG. 14 shows the resulting assembly, where the filled gaps are identified by the reference number 52. Filling of all gaps removes any non-conducting regions from the semiconductor substrate. After the gaps have been filled, the ion implantation, bonding, and separation steps are carried out to produce a continuous SOI structure having two or more substantially single crystal semiconductor regions separated by gaps filled with amorphous semiconductor, e.g., amorphous silicon. The right hand portion of FIG. 12 shows such a continuous SOI structure obtained by gap filling prior to bonding. If the deposition process is carried out at high enough temperatures, the amorphous semiconductor material may crystallize to produce a substantially single crystal semiconductor film on the glass or glass ceramic substrate without any gaps. Again, these aspects of the invention are particularly useful when large area SOI structures are to be produced.

Without intending to limit it in any manner, the present invention will be more fully described by the following examples.

In Examples 5-8 and 13, elemental depth profiles obtained using time-of-flight secondary ion mass spectrometry (ToF-SIMS) are presented. As known in the art, ToF-SIMS is a surface analytical technique that uses an ion beam to remove small numbers of atoms from the outermost atomic layer of a surface.

In broad outline, a short pulse of primary ions strikes the surface, and the secondary ions produced in the sputtering process are extracted from the sample surface and into a time-of-flight mass spectrometer. These secondary ions are dispersed in time according to their velocities (which are proportional to their mass/charge ratio m/z). Discrete packets of ions of differing mass are detected as a function of time at the end of the flight tube. ToF-SIMS is capable of detecting ions over a large mass range and can generate an image of the lateral distribution of these secondary ions at spatial resolutions of better than 0.15 microns. Pulsed operation of the primary beam allows insulating surfaces to be completely neutralized between pulses using a low energy electron beam.

ToF-SIMS was chosen to analyze the SOI structures produced by the invention because the analysis could be performed without any charge build-up at the surface of insulators. Two ion beams were employed using the dual beam strategy—one for intermittent sputtering and another for analyzing the newly created surface. Analysis was performed using a TRIFT II instrument manufactured by Physical Electronics, Inc., Eden Prairie, Minn. A low energy Cs beam was used to sputter in synchronization with a pulsed Ga beam for analysis. A small piece of the sample was cleaved to fit the ToF-SIMS sample holder (~1 cm²). A 5 kV $^{133}Cs^+$ beam was used for sputtering in conjunction with 15 kV, 600 pA $^{69}Ga^+$ beam for analysis. The Cs beam was rastered over 500□m×

500 µm area of the sample; the Ga beam analyzed a 50 µm× 50 µm window at the center of the Cs-sputtered region.

For each of Examples 5-8 and 13, two types of plots are presented: one type showing the variation of SIMS signal intensities and the other type showing an approximate quantification of these intensities to atomic %. The nominal composition of the base glass was used as an internal standard in accordance with the "relative sensitivity factor" method. The ion signals towards the end of the profile were taken as corresponding to the bulk glass. The ratio of ion intensities $X^+/Si^+$ was used in these calculations, where X denotes a glass component and Si represents the matrix element. The sputter rate of the Cs beam was determined by measuring the crater depth at the end of the experiment. Since this calibration assumes that the sputter is uniform across the analyzed depth, the thickness of each layer could be somewhat different. Thus, as indicated in FIGS. 5B through 8B, the depths, as well as the atomic percent values, are only approximate. Although not explicitly indicated on FIG. 10C, the depths and atomic percent values of this figure are also only approximate.

Each profile of Examples 5-8 and 13 is characterized by the following general sequence of layers: (1) Native oxide on the surface of Si; (2) Silicon film; (3) Interfacial silica film (hybrid region); (4) Alkali-depleted region (or alkaline-earth depleted region in the case of Example 13); (5) Alkali pile-up (or alkaline-earth pile-up region in the case of Example 13); and (6) Base glass.

In these SIMS depth profiles, higher $Si^+$ signals are observed from oxides such as silica and glass regions than from the elemental Si film. This enhancement of the SIMS signal is due to the presence of oxygen and is a well known example of "matrix effects" in SIMS quantification. This effect is counter-intuitive because the elemental silicon film is 100 at % Si whereas the oxide is only 33 at % Si. The SIMS signal from the oxide is significantly larger by more than an order of magnitude. The presence of oxygen at the surface increases the work function thereby reducing the probability of neutralization of ions by electrons. We used this effect to delineate Si from silicon oxide, e.g., $SiO_2$, in these profiles.

In the quantified plots of FIGS. 5B through 8B, Si distribution is not included as it is the matrix element and was not quantified. Therefore, the intensity plots, i.e., FIGS. 5A through 8A, show a better delineation of the various concentration regimes across the analyzed depth. The depletion of alkali leads to higher $B^+$, $Al^+$ and $Si^+$ signals from this region as reflected in the intensity distribution plots. However, for this alkali-depleted region, no attempt was made to correct for the loss of alkali elements on the concentration of B, Al and Si. Similar considerations apply to the depleted region for the alkaline-earth case. Each interface is slightly broadened due to sputter-induced damage.

Reference is now made to FIG. 17, which illustrates an alternative process that may be carried out in order to produce at least an intermediate structure in connection with fabricating the SOG structure of FIG. 2A. For the purposes of discussion, the semiconductor wafer 10 is preferably a substantially single crystal Si wafer, although as discussed above any other suitable semiconductor conductor material may be employed. At action 100, which refers to FIG. 1A, subsurface flaws are created below the first external surface 11 in order to produce separation zone 13. Separation zone 13 may be formed using implantation/exfoliation techniques of the type currently known to those skilled in the art or which may be developed in the future. In one embodiment, the subsurface flaws may be created by implanting hydrogen ions into the wafer 10 (action 102) using the techniques of the references discussed above. Other currently-known techniques can also be used to form the separation zone 13, such as, co-implantation of hydrogen and helium ions or hydrogen and boron ions.

When hydrogen ion implantation techniques are used to create the separation zone 13, it is preferred to treat the first exterior surface 11 to reduce the hydrogen ion concentration thereof. Although the invention is not limited to any theory of operation, it is believed that a high hydrogen ion concentration at the termination of the first exterior surface 11 inhibits the bonding process of the wafer 10 to the glass substrate 20. More particularly, it is believed that a high hydrogen ion concentration at the termination of the first exterior surface 11 causes a repulsive force to develop between the wafer 10 and the glass substrate 20.

Various approaches can be used to reduce the hydrogen concentration on the surface of an implanted wafer. Preferred approaches involve a mild oxidation treatment of the surface, such as, treatment of the wafer in oxygen plasma, ozone treatments, treatment with hydrogen peroxide, hydrogen peroxide and ammonia, hydrogen peroxide and an acid or a combination of these processes. Although not wishing to be bound by any particular theory of operation, it is believed that during these treatments, hydrogen terminated surface groups oxidize to hydroxyl groups, which in turn makes the surface of the silicon wafer hydrophilic. The treatment is preferably carried out at room temperature for the oxygen plasma and at temperatures between about 25-150 degrees C. for the ammonia or acid treatments.

In an alternative embodiment, the hydrogen ion concentration is not reduced and any repulsive force between the wafer 10 and the glass substrate 20 is overcome via application of pressure.

At action 106, the mating surfaces of the semiconductor wafer 10 and the glass substrate 20 are prepared. For example, the glass substrate 20 may be washed in a detergent followed by distilled water. The glass substrate may also be further washed with nitric acid and then distilled water.

At action 108, the glass substrate 20 is preferably bonded to the semiconductor wafer 10 using the electrolysis process discussed hereinabove. Portions of this process are discussed below. As an initial step, the glass substrate 20 is brought into contact with the semiconductor wafer 10. Notably, a vacuum chamber is preferably not used to facilitate intimate contact of the contacting surfaces. In an alternative embodiment, the wafer 10 and the glass substrate 20 may be placed into a vacuum chamber and a pulsed vacuum applied, preferably at room temperature, to remove any trapped air between the wafers. In a further alternative embodiment, the wafer 10 and the glass substrate 20 may be brought into contact in a standard air environment in which a pressure application is used to provide intimate contact and eliminate any air bubbles.

Prior to or after the contact, the semiconductor wafer 10 and the glass substrate 20 are heated under a differential temperature gradient. Preferably the glass substrate 20 is heated to a higher temperature than the semiconductor wafer 10. By way of example, the temperature difference between the glass substrate 20 and the semiconductor wafer 10 is at least 10 degrees C., although the difference may be as high as about 100 to about 150 degrees C. This temperature differential is desirable for a glass having a coefficient of thermal expansion (CTE) matched to that of silicon since it facilitates later separation of the layer 15 from the semiconductor wafer 10 due to thermal stresses.

Once the temperature differential between the glass substrate 20 and the semiconductor wafer 10 is stabilized, any spacers may be removed and mechanical pressure may be applied to the intermediate assembly. The preferred pressure range is between about 1 to about 50 psi. Application of higher pressures, e.g., pressures above 100 psi, might cause breakage of the glass wafer.

The glass substrate 20 and the semiconductor wafer 10 are preferably taken to a temperature within about +/−150 degrees C. of the strain point of the glass substrate 20. In an alternative embodiment, The glass substrate 20 and the semiconductor wafer 10 may be taken to a temperature within about +/−300 degrees C. of the strain point of the glass substrate 20.

Next, a voltage is applied across the intermediate assembly, preferably with the semiconductor wafer 10 at the positive electrode and the glass substrate 20 the negative electrode. The application of the voltage potential causes alkali or alkaline earth ions in the glass substrate 20 to move away from the semiconductor/glass interface further into the glass substrate 20. This accomplishes two functions: (i) an alkali or alkaline earth ion free interface is created; and (ii) the glass substrate 20 becomes very reactive and bonds to the semiconductor layer 15 strongly with the application of heat at relatively low temperatures.

At action 110, after the intermediate assembly is held under these conditions for some time (e.g., approximately 1 hr or less), the voltage is removed and the intermediate assembly is allowed to cool to room temperature. The semiconductor wafer 10 and the glass substrate 20 are then separated, which may include some peeling if they have not already become completely free, to obtain a glass substrate 20 with a thin semiconductor layer 15 bonded thereto.

The separation is preferably accomplished via fracture of the imperfections in the separation zone 13 due to thermal stresses. Alternatively or in addition, mechanical stresses such as water jet cutting or chemical etching may be used to facilitate the separation.

At action 112, after separation, the resulting structure may include the glass substrate 20 and the semiconductor layer 15 bonded thereto. The remaining semiconductor layer 15 may be polished, e.g., via CMP or other techniques known in the art.

Advantageously, the ability to bond the semiconductor wafer 10 to the glass substrate 20 in a standard atmosphere, such as air, nitrogen or argon without a vacuum makes the bonding equipment an order of magnitude (and possibly two orders of magnitude) less expensive. This is a significant attribute because bonding costs are believed to be among the highest cost items for the SiOG process at this time. Reductions in bonding costs, therefore, will make the SiOG substrate more attractive economically, particularly when the process is applied to large size substrates.

The following examples demonstrate further details of at lease some of the embodiments discussed above:

Reference is now made to FIG. 18, which is a schematic diagram of the intermediate structure prior to and/or during the bonding process. The structure includes the exfoliation layer 15 in contact with the glass substrate 20. While the semiconductor wafer 10 and the glass substrate 20 effectively form the electrodes in the electrolysis bonding process, additional electrode plates 120A and 120B may be employed to apply the proper voltage across the structure. In addition, at least one heated platen 122A, 122B may be used to apply heat to the structure. For example, one platen 122A may be used to heat the semiconductor wafer 10 to a first temperature (e.g., 525 degrees C.), while the other platen 122B may be used to heat the glass substrate 20 to a second temperature (e.g., 575 degrees C.).

In an alternative embodiment of the invention, only one platen 122 may be employed to apply heat to one of the semiconductor wafer 10 and the glass substrate 20. For example, the platen 122B may be used to apply heat to the glass substrate 20 in order attain the second temperature (e.g., 575 degrees C.). Even without platen 122A, the semiconductor wafer 10 will heat due to heat transfer from to glass substrate 20. It has been discovered that the semiconductor wafer 10, however, will heat to a lower temperature than the glass substrate 20, which is a desirable property.

Advantageously, use of the one or more heated platens simplifies the heating process and reduces cost, among other reasons, because only one surface of the structure needs to be heated. This is particularly useful when large scale SOG structures are fabricated.

EXAMPLE 1

A 4-inch diameter phosphorus-doped silicon wafer (hereinafter referred to as the "silicon wafer") having a thickness of 0.525 mm was implanted with hydrogen ions at 69 KeV at a concentration of $6 \times 10^{16}$ ions/cm$^2$ using commercially available, room temperature, ion implantation techniques. The phosphorus-doped silicon had a 0° C. CTE of $24 \times 10^{-7}$/° C. and a 300° C. CTE of $38 \times 10^{-7}$/° C. The wafer was obtained from SiliconSense Inc., Nashua, N.H., and, as reported by the manufacturer, had a resistivity of 1-10 ohm·cm. Boron-doped silicon wafers were also used in various of the examples with equivalent results to the phosphorus-doped wafers.

A 4-inch diameter glass wafer having a thickness of 1 mm was washed in detergent, rinsed in distilled water, soaked in 10% nitric acid for 1 hour, and finally rinsed again in distilled water. It was then placed in a clean room hood and allowed to dry.

The glass wafer was made of CORNING INCORPORATED GLASS COMPOSITION NO. 7070. On a weight percent basis, this glass comprises: 72 wt. % $SiO_2$, 27 wt. % $B_2O_3$, 1.5 wt. % $Li_2O$, and 0.5 wt. % $K_2O$. It has a 0-300° C. CTE of $32 \times 10^{-7}$/° C. and a resistivity of $10^{11.2}$ Ω-cm at 250° C. and $10^{9.1}$ Ω-cm at 350° C.

The glass wafer was placed in a fixture for subsequent mounting on a chuck connected to the "negative" support of a SÜSS MICROTEC bonder (Model SB6) with spacers placed on the top surface of the glass. The spacers were brass and had a thickness of about 0.1 mm. The silicon wafer was placed on top of the spacers with the hydrogen-treated surface towards the glass. The fixture's clamps were then engaged over both the wafers.

The fixture was then placed in the bonder, vacuum was applied down to $10^{-3}$ millibars, and the wafers were heated to 450° C. When the wafers reached the desired temperature, the spacers and the clamps were removed and ram pressure was applied to the wafers (10 psi) through the bonder's plungers. Thereafter, voltage was applied to the wafers through the plungers. Specifically, the difference in potential between the top of the Si wafer and the bottom of the glass wafer was 1000 volts. The $(V_1-V_2)/D$ ratio was thus 6.55 KV/cm.

The wafers were held under these conditions for 1 hour. Finally the temperature, pressure, and voltage were all turned off and the sample was allowed to cool for a period of 2-3 hours.

It was found that the Si and glass wafers had bonded strongly. However, the desired separation of the glass wafer with a thin Si film from the rest of the silicon wafer could not be achieved because both wafers cracked during separation.

The experiment was repeated a number of times with the same result. The glass and the silicon wafers were strongly bonded together but all attempts at separating the wafers resulted in cracking of both the wafers. Varying the cool down period was investigated, but with no success.

EXAMPLE 2

The experiment of Example 1 was repeated except that the two wafers, glass and silicon, were held at 450° C. and 400° C. respectively. This was done to take advantage of the thermal stress generated by the thermal differential to separate the thin silicon film from the silicon wafer after cooling. The differential heating was achieved by selecting the temperatures of the force-applying plungers of the bonder. The 450° C. and 400° C. values represent the temperatures of the plungers and thus the temperatures at the bottom surface of the glass wafer and the top surface of the silicon wafer, respectively, i.e., the temperatures at surfaces 22 and 12 in FIG. 1C In this case, the glass wafer with a 0.4-micron layer of silicon (an SOI configuration) and the remainder of the Si wafer were easily separated, and thus an SOI glass wafer was successfully obtained. This result indicates that the thermal stress generated by a thermal differential is necessary in generating a glass-based SOI structure. In particular, the thermal stress generated by cooling from a thermal differential is necessary for a glass wafer having a CTE matched to that of silicon.

The SOI structures formed using the procedure of this example were suitable for use in electronic, display and solar cell applications.

EXAMPLE 3

In this example, the Si wafer was first etched with a pattern of circular islands separated from one another. The islands were about 150 microns in diameter. This patterned wafer was ion implanted and then the process of Example 2 was used to transfer a Si layer about 0.4 microns thick onto the glass wafer. An SOI structure with an excellent bond between the Si layer and glass wafer was created in this case.

This island technique is expected to be of particular value when making large wafers where a thermal expansion mismatch between the glass and the Si is most likely to lead to delamination or other damage to the SOI structure.

The pattern etched or otherwise formed in the silicon wafer may be any geometric pattern which produces isolated islands of silicon. The size and the distance between the islands can be adjusted according to the requirements. If desired, a thin layer of silicon may be deposited via standard techniques to establish connectivity between all or some of the islands. The same approach can be used with other types of semiconductors.

EXAMPLE 4

The experiment of Example 1 was repeated without the application of voltage across the wafers. In this case, the two wafers did not bond at all indicating that the application of the voltage across the wafers is an essential part of the process.

EXAMPLE 5

Figure 5A:
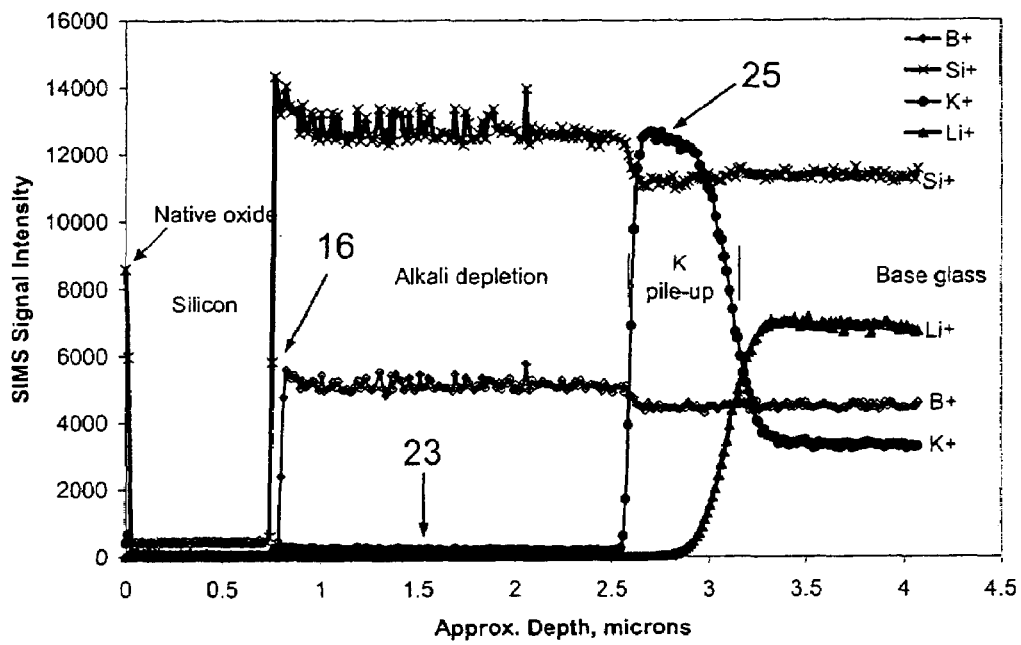
FIGS. 5A and 5B are ToF-SIMS depth profiles of an SOI structure produced in accordance with the invention for a second substrate which includes both Li$^+$ and K$^+$ as mobile positive ions.
Figure 5B:
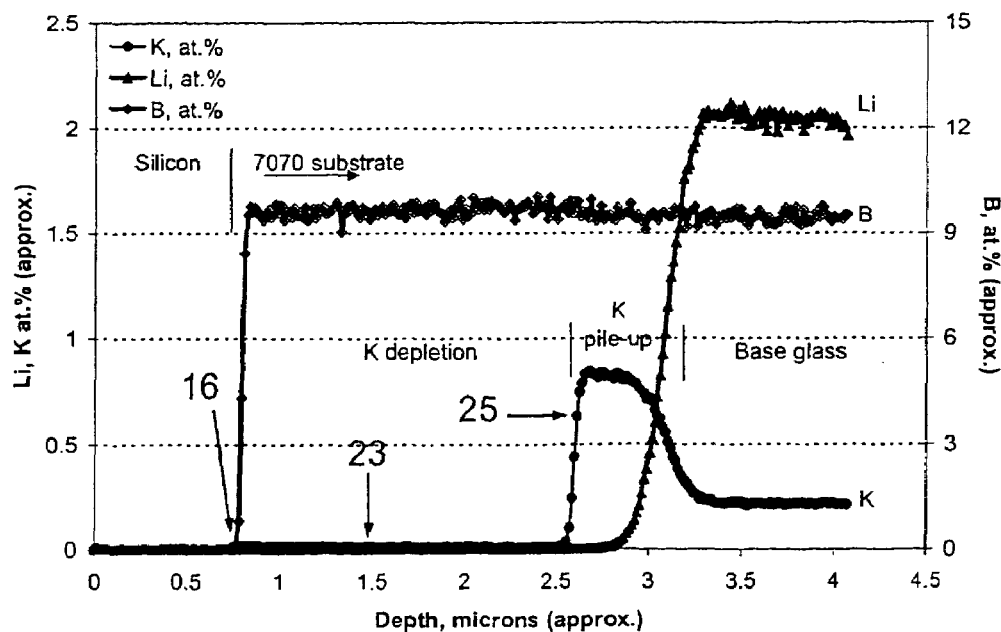
Figure 6A:
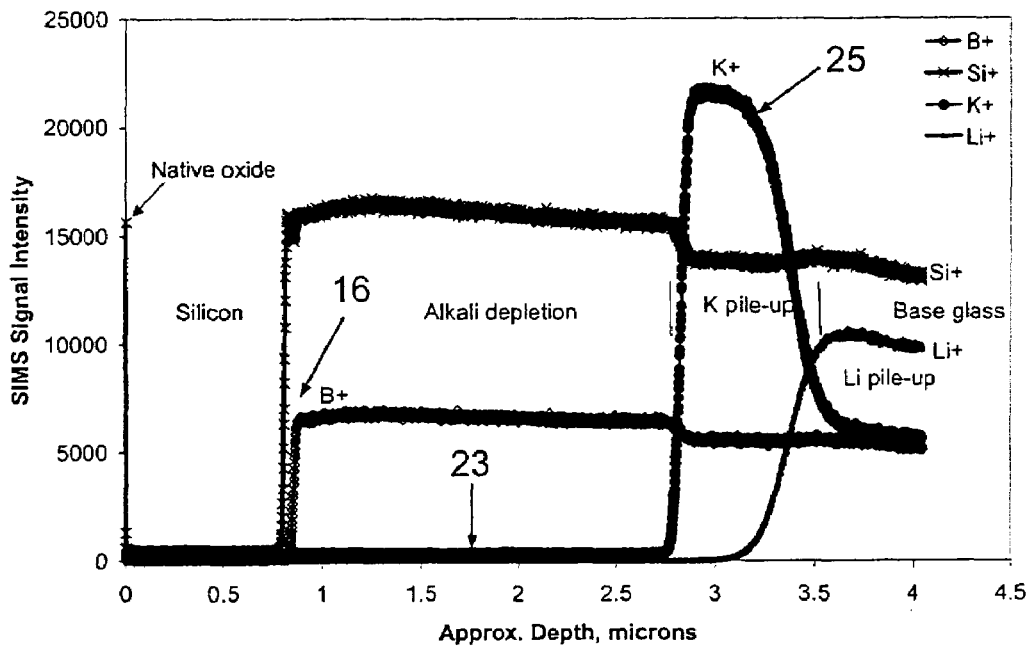
FIGS. 6A and 6B are ToF-SIMS depth profiles of an SOI structure of the type used in FIG. 5 after reheating.
Figure 6B:
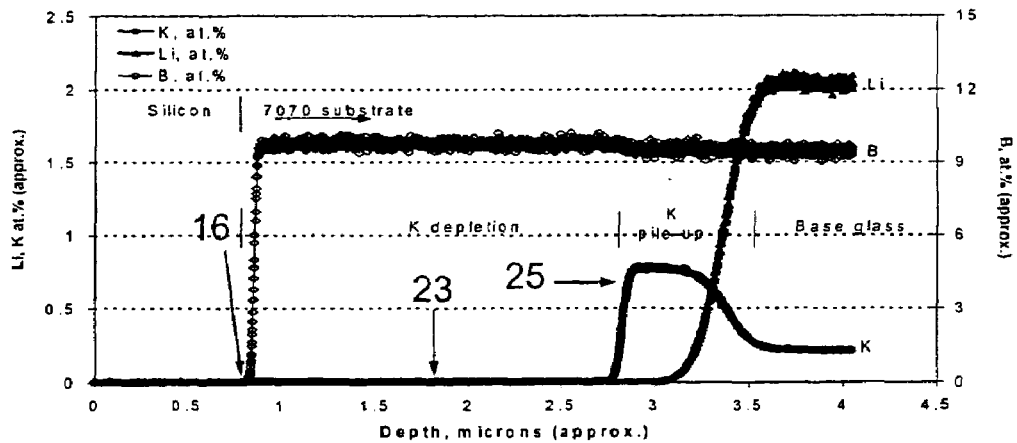

An SOI structure prepared in accordance with Example 2 was subjected to a ToF-SIMS analysis in accordance with the procedures discussed above. The results are shown in FIG. 5, where FIG. 5A plots SIMS signal intensity data versus depth and FIG. 5B shows the same data converted to atomic percent.

Depletion region 23 as well as hybrid region 16 are marked in FIG. 5, along with $K^+$ pile-up region 25. Beginning at a depth of about 4 microns, all of the curves have returned to their bulk glass values.

EXAMPLE 6

An SOI structure prepared in accordance with Example 2 was held at 500° C. for 1 hour under vacuum ($10^{-3}$ millibars). A ToF-SIMS analysis was then preformed. The results are shown in FIG. 6.

A comparison of this figure with FIG. 5 shows that the depletion and hybrid regions, as well as the Si, B, K, and Li curves, are substantially unchanged by the reheating. This is an important result since it shows that the SOI structures of the invention will be stable during further processing and ultimate use.

EXAMPLE 7

The experiment of Example 2 was repeated using a glass wafer made of CORNING INCORPORATED GLASS COMPOSITION NO. 7740. On a weight percent basis, this glass comprises: 81.3 wt. % $SiO_2$, 12.6 wt. % $B_2O_3$, 2.19 wt. % $Al_2O_3$, and 4.2 wt. % $Na_2O$, as well as trace amounts of $Fe_2O_3$ and $K_2O$. It has a 0-300° C. CTE of $32.6 \times 10^{-7}$/° C. and a resistivity of $10^{8.5}$ Ω-cm at 250° C. and $10^{6.6}$ Ω-cm at 350° C.

The same processing conditions, including temperature, pressure, and voltage, and the same wafer dimensions were used as in Example 2.

Figure 7A:
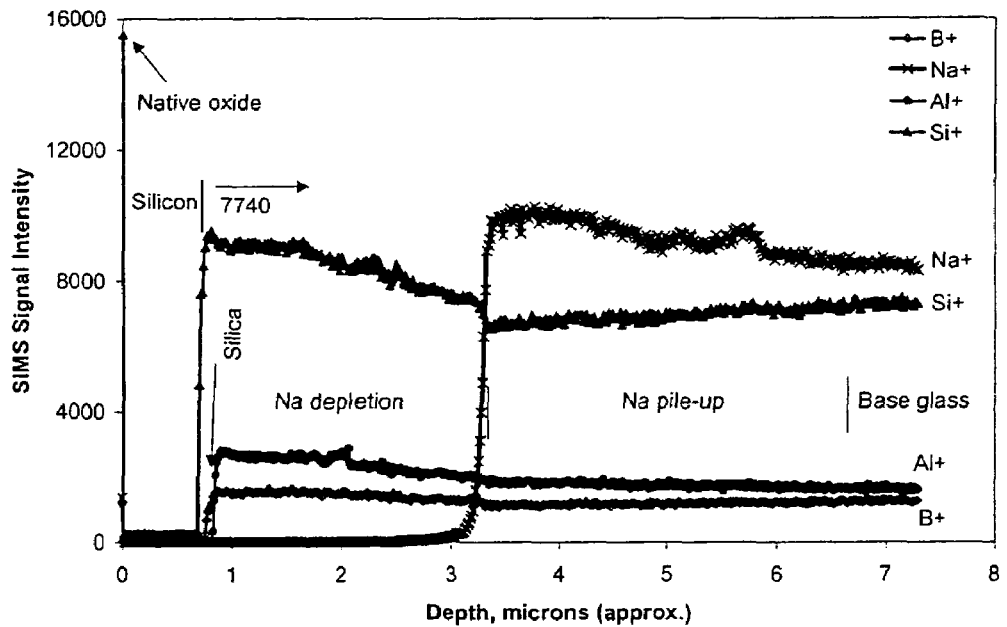
FIGS. 7A and 7B are ToF-SIMS depth profiles of an SOI structure produced in accordance with the invention for a second substrate which includes essentially only Na$^+$ as a mobile positive ion.
Figure 7B:
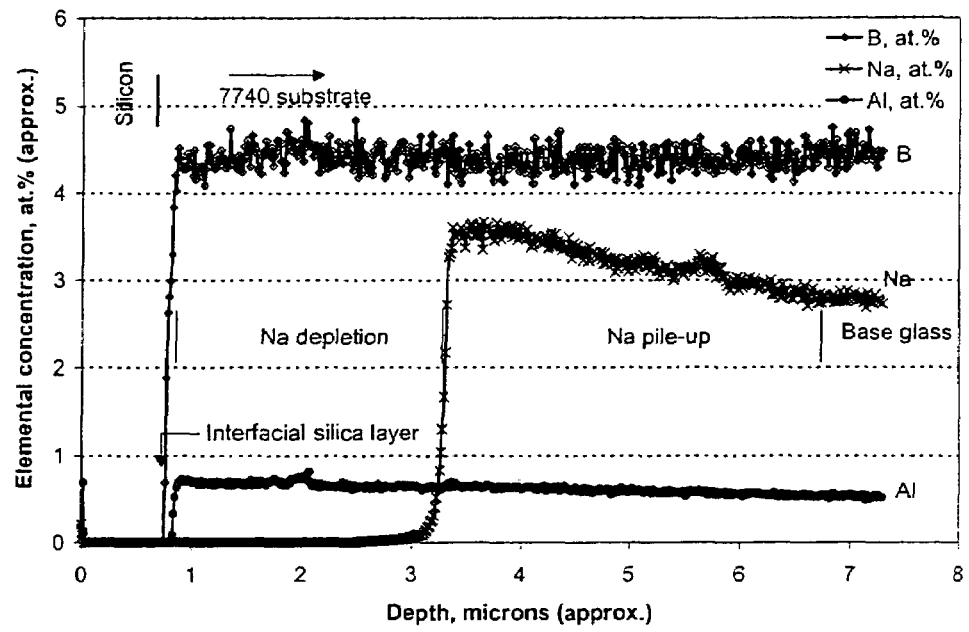
Figure 8A:
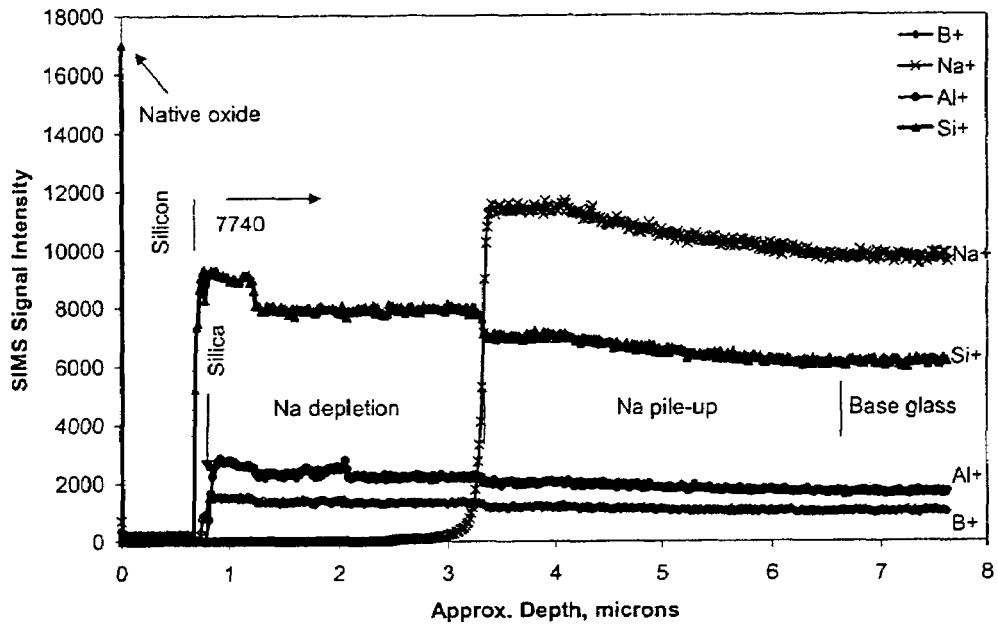
FIGS. 8A and 8B are ToF-SIMS depth profiles of an SOI structure of the type used in FIG. 7 after reheating.
Figure 8B:
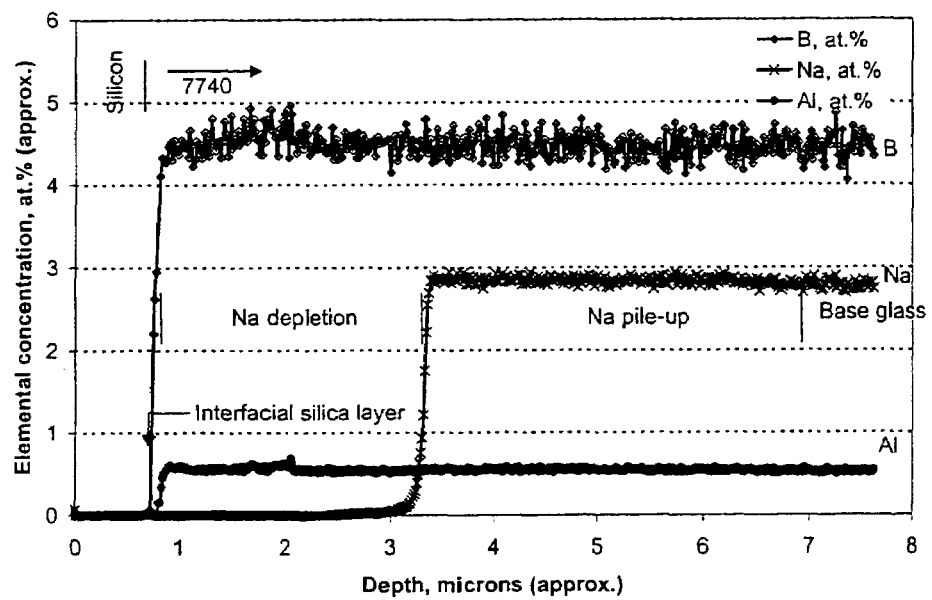

A ToF-SIMS analysis was performed as in Example 5 and the results are shown in FIG. 7. Again, a depletion region, a hybrid region (identified by the word "silica" in FIG. 7A and the phrase "interfacial silica layer" in FIG. 7B), and a pile-up region can be seen in this figure.

EXAMPLE 8

An SOI structure prepared in accordance with Example 7 was held at 500° C. for 1 hour under vacuum ($10^{-3}$ millibars). A ToF-SIMS analysis was then preformed. The results are shown in FIG. 8, where the same nomenclature is used as in FIG. 7.

A comparison of this figure with FIG. 7 shows that the depletion, hybrid, and pile-up regions, as well as the overall shape of the individual concentration curves, are substantially unchanged by the reheating.

EXAMPLE 9

A convergent beam electron distribution function (edf) was obtained for the semiconductor layer of an SOI structure prepared in accordance with Example 2. FIG. 9 shows the resulting transmission micrograph. As can be seen in this figure, the quality of the single crystal layer of Si is excellent.

EXAMPLE 10

Experiments were performed to evaluate the feasibility of obtaining single crystal silicon films on glass and glass-ceramic wafers via thermal bonding without the use of an applied voltage or a temperature differential.

One key issue in bonding a silicon wafer to a glass or glass-ceramic wafer is the well-known problem of contamination of the silicon with mobile ions from the glass or glass-ceramic. In the display industry, for example, the silicon film needed for electronic devices is deposited on a glass substrate after the substrate has been coated with barrier layers of silica and silicon nitride to prevent migration of ions in the glass to the silicon film.

Thermal bonding of silicon directly to a glass or glass-ceramic wafer will cause migration of ions into the silicon which will adversely affect the silicon performance and is thus undesirable. In spite of this issue, experiments were done to evaluate whether such a bonding process is feasible.

The glasses and glass ceramics used in these experiments had different strain point temperatures depending on their composition. Glasses used in display applications are processed below their strain points to avoid dimensional changes, which are not acceptable. The thermal bonding experiments were thus limited to the strain point of the particular compositions evaluated. The following examples describe the experiments which were performed.

EXAMPLE 10A

The glass wafer in this case was made of CORNING INCORPORATED GLASS COMPOSITION NO. 7070, which, as discussed above, is an alkali-borosilicate glass. The strain point of this glass is 450° C.

A 100 mm diameter glass wafer 1 mm thick was polished to a surface roughness of 0.1 nm rms. A silicon wafer 100 microns thick was hydrogen ion implanted at room temperature at a dosage of $7 \times 10^{16}$ ions/cm$^2$ and an implantation energy of 100 KeV. Both the wafers were cleaned using a standard method for cleaning glass, namely, a detergent wash, a distilled-water rinse, a nitric acid treatment, and a final distilled-water rinse, and then brought into contact at room temperature.

The wafer assembly was placed between platinum plates and then thermally heated to 450° C. and held at temperature for 1 hour. At the end of the hour, the furnace was cooled and the plates removed. No bonding was observed between the glass and the silicon wafer other than a low strength frictional bond. The wafers could be easily separated by inserting a razor blade at their interface. There was no trace of a silicon film on the glass. The experiment was repeated at 525° C. with an identical result, i.e., no silicon layer was observed on the glass wafer.

EXAMPLE 10B

The experiment of Example 10A was repeated but in this case the wafer was made of CORNING INCORPORATED GLASS COMPOSITION NO. 7740, which, as discussed above, is an alumino-borosilicate glass. The strain point of the 7740 composition is 540° C., and thus the bonding experiment was done at 540° C.

The result was identical to that of Example 10A, in that no transfer of a silicon film to glass occurred.

EXAMPLE 10C

The experiment of Example 10A was repeated with an alkaline-earth alumino-borosilicate composition, namely, CORNING INCORPORATED GLASS COMPOSITION NO. 1737, a glass used in the display industry. The strain point of this glass is 660° C. and thus the experiment was done at 660° C. Again, in this case, no transfer of a silicon film to the glass wafer was observed. The experiment was repeated using a pre-treatment of the surface of the silicon wafer to reduce the surface's hydrogen concentration (see Example 11 below). Again, no transfer of a silicon film was observed.

EXAMPLE 10D

The experiment of Example 10A was repeated using a glass-ceramic wafer with an alkali and alkaline-earth aluminosilicate composition. The material had a strain point of 810° C. and thus the experiment was performed at 810° C. Again, no transfer of a silicon film to the glass-ceramic wafer was observed. Pre-treatment of the silicon wafer to reduce the hydrogen concentration of its surface (see Example 11 below) did not change the result.

EXAMPLE 10E

The experiments of Examples 10A through 10D were repeated with silicon wafers upon which an oxide layer having a thickness of about 0.2 microns had been grown prior to hydrogen ion implantation. As in Examples 10A through 10D, in each case, no transfer of a silicon film to the glass or glass-ceramic was observed.

Based on these experiments, it has been concluded that thermal bonding of a silicon film from a silicon wafer implanted with hydrogen ions to a glass or glass-ceramic wafer does not occur for bonding temperatures up to the strain point of the glass or glass-ceramic. Higher bonding temperatures are not acceptable because they would result in deformation of the glass or glass ceramic, e.g., sagging and/or compaction of the material. Moreover, as mentioned above, even if such a transfer were achieved at some significantly higher temperature, the issue of ion contamination of the silicon film would still not be resolved.

EXAMPLE 11

This example demonstrates the value of reducing the hydrogen concentration at the surface of a semiconductor wafer which is to be bound to an alkaline-earth containing glass or glass-ceramic.

EXAMPLE 11A

A silicon wafer 100 mm in diameter and 100 microns thick was hydrogen ion implanted at a dosage of $8 \times 10^{16}$ ions/cm$^2$ and an implantation energy of 100 KeV. The wafer was then cleaned in distilled water. The contact angle measured on this wafer was 70 degrees indicating a very hydrophobic surface.

A glass wafer composed of CORNING INCORPORATED GLASS COMPOSITION NO. 1737 was washed with FISHER SCIENTIFIC CONTRAD 70 detergent in an ultrasonic bath for 15 minutes followed by a distilled water wash for 15 minutes in the ultrasonic bath. Thereafter, the wafer was washed in 10% nitric acid followed by another distilled water wash. The silicon wafer was not cleaned in the detergent to avoid contamination of the wafer surface. Both wafers were given a final cleaning in a spin washer dryer with distilled water in a clean room.

The two wafers were then processed using the processing steps of Example 2 and the SÜSS MICROTEC bonder of that example. Thus, the glass wafer was placed on the bonder's negative plunger and the silicon wafer was placed on the positive plunger and held away from the glass wafer with spacers. The two wafers were heated to 525° C. (silicon wafer) and 575° C. (glass wafer) and then brought into contact.

In particular, a potential of 1750 volts was applied at the center of the silicon wafer for a minute using the moveable center portion of the positive plunger and then the applied potential was removed. The spacers were then removed and a potential of 1750 volts was applied across the wafer surface. The voltage was applied for 20 minutes at the end of which the voltage was brought to zero and the wafers were cooled to room temperature. As in Example 2, the bonding was performed under vacuum conditions.

At the end of the bonding process, the wafers could be separated easily. However, there was only a partial transfer of a Si film to the glass substrate. In particular, only about 10% of the glass was covered with a Si film and even in the covered area, the Si film was very non-uniform. The process thus had not given a good quality Si film, as was desired.

EXAMPLE 11B

The experiment of Example 11A was repeated except the silicon wafer was now treated in the following way.

First, the silicon wafer was placed in a cold solution of ammonia: hydrogen peroxide: water in the ratio of 1:2:7, and then the solution was heated to 70° C. gradually. After holding the wafer in the solution for 15 minutes at temperature, the solution was cooled and the wafer was washed in the ultrasonic bath with distilled water for 2.5 minutes. At this point the wafer showed a highly hydrophilic character with a contact angle of 10 degrees. The silicon wafer was then washed in a hydrochloric acid: hydrogen peroxide: water solution in a 1:2:8 ratio similar to the process for the ammonia solution. The treated silicon wafer was then washed in distilled water.

The silicon wafer was then bonded to a 1737 glass wafer washed as in Example 11A. The same process cycle as in Example 11A was used. After the bonding cycle, the glass wafer had an excellent, uniform Si film attached over its entire surface.

This example shows that surface treatment of the silicon wafer after implantation is needed to carry out Si layer transfer to a glass composition containing alkaline-earth ions.

EXAMPLE 11C

In this example, the wafer was cleaned with an ammonia and hydrogen peroxide solution, but not with the acid solution used in Example 11B.

The experiment of Example 11A was repeated except that the silicon wafer was now treated in the following way.

First, the silicon wafer was placed in a cold solution of ammonia: hydrogen peroxide: water in the ratio of 1:2:7, and then the solution was heated to 70° C. gradually. After holding the wafer in solution for 15 minutes at temperature the solution was cooled and the wafer was washed in the ultrasonic bath with distilled water for 2.5 minutes. At this point the wafer showed a highly hydrophilic character with a contact angle of 10 degrees. The treated silicon wafer was then washed in distilled water and the bonding process was carried out with a 1737 glass wafer washed as in Example 11A, using the same process cycle as in that example. After the bonding cycle, the glass wafer had an excellent, uniform Si film attached over its entire surface.

EXAMPLE 11D

This example shows that oxygen plasma treatment, instead of an ammonia and hydrogen peroxide treatment, may also be used to surface treat and thus control the hydrogen ion concentration of a semiconductor wafer.

In this example, a silicon wafer was treated in an oxygen plasma at room temperature for ten minutes. This treatment was followed by a distilled water rinse. The wafer was then dried and subjected to the bonding process as in Example 11A. As in Examples 11B and 11C, an excellent Si film covering the entire glass wafer was obtained.

EXAMPLE 11E

Experiments were carried out to measure the surface hydrogen ion concentration after the surface treatments of Examples 11A through 11D. The hydrogen concentrations at the surfaces of the silicon wafers were measured using a ToF-SIMS analysis. Normalized intensity values were obtained by dividing the individual peak intensity by the total spectral intensity and multiplying by 10000. For the surface treatment protocol of Example 11A, a value of 414 was obtained (hereinafter referred to as the "as-implanted" hydrogen concentration).

The results of these experiments are set forth in Table 2. As shown therein, the normalized signal intensity for the silicon wafer treated in accordance with Example 11B was 102, which represents a 75% reduction in hydrogen ion concentration compared to the as-implanted wafer, while for the treatment of Example 11C, the signal intensity was 101 or 76% less than the as-implanted value. For the oxygen plasma treatment, the signal intensity was 144 or a 65% reduction compared to the as-implanted wafer. An experiment was also performed in which an aqueous solution of hydrogen peroxide without ammonia was used to treat the silicon wafer. The normalized signal intensity in this case was 307 or 26% of the as-implanted value.

These examples demonstrate that a reduced hydrogen concentration on the surface of a semiconductor wafer leads to improved film formation during bonding to substrates containing alkaline-earth ions.

EXAMPLE 12

This example demonstrates the high bond strengths achieved in accordance with the invention for silicon films transferred to glass wafers composed of CORNING INCORPORATED GLASS COMPOSITIONS NOS. 7070, 7740, 1737, and EAGLE 2000™. The composition of the 7070 and 7740 glasses are set forth above in Examples 1 and 7, respectively; the composition of the EAGLE 2000™ and 1737 glasses correspond to Example 14 and the comparative example of U.S. Pat. No. 6,319,867, respectively.

The process steps of Example 2 were used to prepare the SOI structures with the addition of a hydrogen reduction pretreatment of the silicon wafer for the 1737 and EAGLE 2000™ glasses which include alkaline-earth ions. Specifically, the silicon wafers for these glasses were treated in accordance with the procedures of Example 11B, although any of Examples 11B through 11D or other treatment approaches for reducing surface hydrogen could have been used. Bond energy values were determined using the indentation procedure discussed above and the calculation procedure of the above-referenced Marshall and Evans publication.

In particular, to determine bond strength, the sample was mounted with the coating surface facing up so that the coating surface was assessable by the indenter probe. To provide a stable, rigid support, the sample was bonded to a 1.25" diameter aluminum sample stub supplied with the Nano Indenter II using double-sided tape.

The adhesion characteristics of the sample were then assessed by producing an array of indentations using a range of indentation loads. The array was selected to survey the coating response as a function of load and was carried out in more than a single general location to check for variability in coating response across the sample. Using standard nanoindentation protocols, the positions of the indentations were pre-selected using microscopic observation to identify appropriate regions of the surface for testing. In particular, the positions were selected to avoid regions of the surface which showed evidence of contamination or handling damage.

The testing was conducted using a diamond indenter with the Berkovich geometry. The loading of the indenter was computer controlled using a programmed sequence of loading and unloading conditions. The sequence of conditions used was as follows: (1) approach segment; (2) load segment (constant strain rate of 0.1 sec$^{-1}$ to maximum load); (3) unload segment (unload rate=90% of maximum loading rate); (4) hold segment; and (5) unload segment.

The peak load in step 2 was typically varied to attain peak loads of 8.5 mN, 37.6 mN, 165 mN, and 405 mN. For each region of interest on the sample, a minimum of 2 indentations were made for each load. Depending on the observed response, additional testing at intermediate loads was used to identify the critical load required to induce delamination or to determine the delamination versus load response.

Following indentation, the test locations were inspected for evidence of coating delamination using low to high magnification Nomarski DIC (differential interference contrast) optical microscopy. When present, film delaminations around the indentation sight are typically identifiable from buckling or other surface irregularities. Nomarski DIC is particularly sensitive to this type of surface disturbance due to its high sensitivity to very small height changes (as small as a few Angstroms). If delaminations had been present, their radii would have been measured and the model of the Marshall and Evans reference cited above would have been used to determine a critical interfacial fracture energy that represents a fundamental measure of the coating adhesion to the substrate. In the absence of delamination, as occurred for the SOI structures of the invention, a lower bound to the interfacial fracture energy was estimated by assuming some minimum delamination region that is slightly larger (1-2 microns) than the size of the indentation itself.

In determining interfacial fracture energy, it was assumed that there was no residual coating stress in the samples tested (i.e., it was is assumed that the coating was stress free) and that the indentation stress field was thus the sole driving force for film delamination. For this case, the strain energy release rate was calculated using equation 12 from the Marshall and Evans reference:

$$G=(1-v^2)t\sigma_i^2/2E \quad \text{(eqn. 12 from Marshall and Evans)}$$

where: $\sigma_i = V_i E/2\pi t a^2(1-v)$ (eqn. 10 from Marshall and Evans); v=Poisson's ratio of the coating material; t=coating thickness; E=Young's modulus of the coating; a=radius of the debonded region; and Vi=volume of the indentation (based on indent size and indenter shape).

For the silicon-based films of the invention, the following values were used for v and E: v=0.25; E=160 GPa 0.25. Vi for the Berkovich identer is an experimental variable and it is based on the identer used and thus was measured and varies for each test/data point, while the thickness of the silicon-based film (coating) was about 0.4 microns in all cases.

Initial experiments were performed with 7070 glass processed at 450° C. with the silicon wafer at 400° C. The 7070 glass contains Li and K as the mobile alkali ions. In the bond energy test, the glass wafer failed before the bond with the Si film could be broken. Based on this result, a minimum in bond energy was estimated at 15-20 J/m$^2$.

For comparison, literature data shows the bond energy for a Si—SiO$_2$ thermal bond created at 450° C. is 1 J/m$^2$. Thus, at an equivalent temperature, the SOI structures of the invention have a bond energy that is 15-20× higher than the thermal process.

The experiment was repeated with EAGLE 2000™ glass with the glass wafer held at 575° C. and the silicon wafer at 525° C. This glass does not contain any alkali ions, the mobile ions being alkaline-earth ions, specifically, Ca, Mg and Sr. The bond strength measurements were carried out as before, and again it was found that only a lower bound on the bond energy could be obtained because the glass wafer failed before the bond between the silicon film and glass wafer broke. The lower bound was again 15-20 J/m$^2$ indicating that the inventive process produces very high quality and high strength bonds at low temperatures.

These experiments, as well as corresponding experiments with the 7740 and 1737 glasses, are summarized in Table 3. In each case, the bond was very strong and the glass wafer broke before any delamination of the film from the glass was observed. The bond energy measured at the point of breakage is thus a lower bound on the bond energy.

EXAMPLE 13

An SOI structure was prepared using CORNING INCORPORATED GLASS COMPOSITION NO. 1737 and the procedures described above.

A wafer of the 1737 glass (0.7 mm thick) was washed and cleaned as described above. A boron-doped silicon wafer 500 microns thick was hydrogen ion implanted at room temperature at a dosage of 7×10$^{16}$ ions/cm$^2$ and an implantation energy of 100 KeV. The wafer was then treated to reduce the hydrogen ion concentration on the surface using the procedures of Example 11B, although any of Examples 11B through 11D or other treatment approaches for reducing surface hydrogen could have been used.

The two wafers were then placed on a support, separated from each other by spacers. The assembly was loaded into the bonder, vacuum pulled on the system, and temperature increased (top silicon wafer was raised to 525° C. and that of glass wafer to 575° C.). The wafers were then brought in contact and voltage applied. After a 15 minute application of voltage, the voltage was removed, and the wafers cooled down. The wafers separated into two during cooling, i.e., into the glass wafer with a thin silicon film bonded thereto and the silicon mother wafer minus the thin film.

A ToF-SIMS analysis in accordance with the procedures discussed above was performed on the SOI structure obtained in this way. The results are shown in FIG. 10, where FIGS. 10A and 10B plot SIMS signal intensity data versus depth and FIG. 10C shows the data converted to atomic percent.

The barium depletion and pile-up regions are specifically marked in FIGS. 10A and 10C, and the overall alkaline-earth (AE) depletion region is marked in FIG. 10B. The hybrid (silica) region at the interface between the silicon film and the glass substrate is also marked in FIGS. 10A and 10B. Beginning at a depth of about 0.6 microns, all of the curves have returned to their bulk glass values.

As these figures show, a barrier (depletion) layer is formed between the silicon film and the glass which will allow the structure to be used in the manufacture of electronic components without concern for ion migration into the silicon film. To demonstrate the stability of the barrier layer, an SOI structure prepared as described above was heat treated at 595° C.

for 2 hours in vacuum and a TOF-SIMS analysis was performed on the heat treated structure. The analysis revealed that there was no movement of ions due to the heat treatment and the barrier layer was permanent.

EXAMPLE 14

This example demonstrates how the formation of the depletion and pile-up regions depends on process conditions. CORNING INCORPORATED GLASS COMPOSITION NO. EAGLE 2000™ was used for these experiments. The SOI structures were formed using the procedures discussed above and included a hydrogen reduction pretreatment of the silicon wafer.

The following process conditions were varied: (1) glass temperature, (2) applied voltage, and (3) bonding time. The silicon wafer was in all cases 50° C. cooler than the glass wafer. The parameters determined were the thickness of the depletion region (barrier layer) and the identity of the ions which exhibited a clear pile-up region.

The results are shown in Table 4. As can be seen therein, both time and temperature cutoffs appear to exist for the creation of a barrier layer and a pile-up region. Specifically, from this data it can be seen that the processing time needs to be above 2 minutes and the processing temperature needs to be above 350° C. to obtain a barrier layer and a pile-up region for this glass. Although voltages less than 800 volts were not studied, it is believed that a cutoff will also exist for this process variable. Similar cutoffs will exist for other glasses, although the specific values are expected to be different from those found for the EAGLE 2000™ glass.

EXAMPLE 15

This example illustrates the application of the invention to the production of thin film transistors (TFTs) for display applications, including organic light-emitting diode (OLED) displays and liquid crystal displays (LCDs).

TFTs are used in displays to control the switching of individual pixel elements. For optimum display performance, and also to enable integration of driver electronics, the TFT material should have fast carrier mobility with high uniformity. Current state-of-the-art processes rely on TFTs fabricated from amorphous or polycrystalline silicon (poly-Si) films. However the carrier mobility in devices made from these materials is one to five orders of magnitude lower than in bulk silicon, with a variability of up to ±30%. Bulk silicon represents the ideal material for fabricating TFTs, but prior to the present invention, no practical process has been developed capable of producing a substantially single crystal silicon film on display glass substrates.

The prior art process for producing TFTs consists of a series of steps beginning with deposition of barrier layers of $SiN_x$ and $SiO_2$ followed by amorphous silicon deposition and dehydrogenation of the film. After dehydrogenation, the silicon film is crystallized via laser or thermal crystallization to obtain a poly-Si film with electron field-effect mobility of around 100-350 $cm^2/V \cdot sec$. From this film, the TFTs are built via a series of steps consisting of photolithography, followed by deposition of a gate oxide by PECVD, metal gate deposition, and more photolithography steps followed by a hydrogenation step to obtain good performance (by passivating defects between crystalline regions). See Applied Surface Science, 9602, 1-13 (2003)

FIG. 15 shows a typical TFT structure for use in an LCD constructed in accordance with the prior art process. In this figure, 60 represents the overall TFT, 61 represents the glass substrate, 62 represents metal contacts, 63 represents a metal gate, 64 represents an $SiO_2$ gate insulator, 65 represents a poly-Si layer, and 66 and 67 represent the two barrier layers ($SiO_2$ and $SiN_x$, respectively) that need to be deposited before deposition of silicon.

As discussed above, the present invention provides a practical method for obtaining substantially single crystal silicon on glass (SOG) structures. These structures are particularly well-suited for further processing to build TFTs. Since the SOG comprises a substantially single crystal silicon film, the process to build TFTs in accordance with the invention is different from the prior art process. In particular, the process represents a simplification over current processes. Table 5 sets forth the various steps of the prior art process which can be eliminated through the use of the present invention.

In particular, for the TFT process of the present invention, the dehydrogenation and crystallization steps are not required since the semiconductor film is already in substantially single crystal form. As such, the film can have electron mobilities of over 600 $cm^2/V \cdot sec$. The rehydrogenation step required in the prior art process is also not required. These simplifications in the TFT manufacturing process provide both capital cost and throughput advantages, as well as the inherent improvement in device performance.

The resulting high performance TFTs produced in accordance with the invention allow for miniaturization of electronics, more uniform display performance, integration of driver circuits on the glass substrate, and subsequent significant power savings in the completed displays. The resulting high performance displays can be used in a variety of products, including, palm tops, cell phones, and the like. Further application for the SOG structures of the invention can be found in silicon-on-insulator (SOI) electronics.

EXAMPLE 16

This example illustrates tiling of multiple first layers 15 on a single second layer 20 (see FIG. 11).

A boron doped silicon wafer (100 mm diameter) with resistivity of 1-10 ohm-cm was hydrogen ion implanted at a dosage of $8 \times 10^{16}$ $ions/cm^2$ and an energy of 100 KeV. An alumino-borosilicate glass wafer (specifically, a wafer composed of CORNING INCORPORATED GLASS COMPOSITION NO. 7740) of 100 mm diameter was cleaned using a standard method for cleaning glass, namely, a detergent wash, a distilled-water rinse, a nitric acid treatment, and a final distilled-water rinse. The silicon wafer was scored into two pieces and broken. The pieces were then cleaned in distilled water, an ammonia and hydrogen peroxide solution, dried and then assembled on the glass wafer manually to minimize the gap between the two silicon pieces.

The resulting assembly was then placed in the SÜSS MICROTEC bonder. The bonder was evacuated and the assembly was heated to 450° C. on the glass wafer end and 400° C. on the silicon wafer end. The glass wafer was placed on the negative electrode and the silicon on the positive electrode. After the desired temperatures were achieved, a 10 psi pressure was applied to ensure good contact between the wafers. 750 volts were then applied to the center of the wafer for one minute to start the bonding process and then the voltage was removed. At this point, 500 volts were applied to the entire wafer and the assembly held under these conditions for 15 minutes. After 15 minutes, the electric potential was removed, and the assembly was cooled to room temperature.

Both silicon pieces could be easily removed from the assembly leaving a thin film of silicon on the entire glass wafer. The distance between the films from the two silicon pieces was about 10 microns.

The foregoing procedures were repeated except that the silicon wafer was broken into five pieces and then was assembled on the 100 mm glass wafer. All five pieces were found to have left a silicon film behind on the glass wafer at the end of the process.

From the foregoing disclosure, including the foregoing examples, it can be readily seen that the present invention provides new and improved SOI structures and new and improved processes for producing such structures. FIG. 16 is a schematic flow chart showing a preferred embodiment of the invention in which SOG structures, specifically, silicon-on-glass structures, are produced using various of the features of the invention. Among other things, this figure illustrates hydrogen ion implantation, bonding through a combination of voltage and heat, separation through cooling, and reuse of the silicon wafer to reduce raw material costs.

EXAMPLE 17

A silicon wafer of 100 mm in diameter and 100 microns thick was hydrogen ion implanted at a dosage of 8×10*16 ions/cm2 and an implantation energy of 100 KeV. The wafer was then treated in oxygen plasma to oxidize the surface groups. An Eagle® glass wafer of 100 mm in diameter was then washed with Fischer scientific Contrad 70 detergent in ultrasonic bath for fifteen minutes followed by distilled water wash for fifteen minutes in ultrasonic bath and then washed in 10% nitric acid followed by distilled water wash again. Both wafers were finally cleaned in a spin washer dryer with distilled water in a clean room.

Next, the wafers were placed in a Suss Microtech bonder. The glass wafer was placed on the negative electrode and the silicon wafer was placed on the positive electrode and held away from the glass wafer with spacers. The two wafers were heated to 525 degrees C. (silicon wafer) and 575 degrees C. (glass wafer) in a nitrogen atmosphere (without a vacuum) and then brought in contact. A potential of 1750 Volts was then applied across the wafer surfaces. The voltage was applied for twenty minutes at the end of which the voltage was brought to zero and the wafers were cooled to room temperature.

The wafers were separated easily. Excellent quality samples having strongly adhered, thin silicon films (about 500 nm) on the glass surface were obtained. Although FIG. 19 shows the TOF-SiMs analysis for the process in air, the illustrate barrier layer formation is indicative of the same process in nitrogen. Advantageously, this example shows that a nitrogen environment (without vacuum) may be used to carry out the bonding and layer separation process.

EXAMPLE 18

The experiment of EXAMPLE 17 was repeated in an air atmosphere but with a potential of 1750 volts across the wafers. Again excellent quality samples of silicon film on glass were obtained in this experiment, establishing that a high vacuum bonding process is not essential for this SiOG wafers. FIG. 19 shows the TOF-SiMs analysis of the interface between the glass and the silicon film indicating excellent barrier layer formation in this process.

EXAMPLE 19

In this experiment the glass and silicon wafer after cleaning were brought into contact and the air pockets were eliminated via application of slight pressure on the wafers. The wafers were then placed between two steel electrodes with a graphoil sheet between the steel and the wafers to allow electrical contact. The assembly was then placed in a standard air atmosphere furnace. Weight was placed on the steel plate to apply about 1 psi of pressure on the wafers. The whole assembly was heated in a furnace to 650° C. An electric potential of 1750 volts was applied across the electrodes. After ten minutes the potential was removed and the furnace was allowed to cool. Upon disassembly, the glass wafer separated with a thin silicon film. This example demonstrates use of simple equipment for the bonding process. TOF-SIMs analysis showed barrier layer formation as in EXAMPLE 18 above. This process example may also be carried out in air on a hot-plate equipment as discussed above in connection with FIG. 18. Again, the advantage of the hot-plate equipment is that only one surface needs to be heated.

Although specific embodiments of the invention have been described and illustrated, it will be apparent to those skilled in the art that modifications and variations can be made without departing from the invention's spirit and scope. The following claims are thus intended to cover the specific embodiments set forth herein as well as such modifications, variations, and equivalents.

TABLE 1

| Num | Element |
| --- | --- |
| 10 | first substrate (i.e., a substantially single-crystal semiconductor material) |
| 11 | first bonding surface/first face of first layer |
| 12 | first force-applying surface |
| 13 | separation zone |
| 13a | sub-portion of separation zone after step (D) |
| 13b | sub-portion of separation zone after step (D)/second face of first layer |
| 14 | first part of first substrate |
| 15 | second part of first substrate/first layer |
| 16 | hybrid region of first substrate after step (C)/hybrid region of first layer |
| 16a | distal edge/thickness defining surface of hybrid region |
| 17 | reference surface, e.g., a reference plane |
| 18 | Optional recesses in first substrate |
| 19 | Optional isolated regions of first substrate |
| 20 | second substrate (i.e., an oxide glass or an oxide glass-ceramic)/second layer |
| 21 | second bonding surface/first face of second layer |
| 22 | second force applying surface/second face of second layer |
| 23 | depletion region of second substrate after step (C)/depletion region of second layer |
| 23a | distal edge/thickness defining surface of depletion region |

TABLE 1-continued

| Num | Element |
|---|---|
| 24 | reference surface, e.g., a reference plane |
| 25 | pile-up region of second substrate after step (C)/pile-up region of second layer |
| 30 | interface region between first and second substrates after step (C) |
| 40 | processing chamber |
| 41 | conductive support |
| 50 | Multiple first layer/single second layer assembly |
| 51 | gap between closely-spaced first layers |
| 52 | filled gap between adjacent first substrates |
| 60 | TFT |
| 61 | glass substrate |
| 62 | metal contacts |
| 63 | metal gate |
| 64 | $SiO_2$ gate insulator |
| 65 | poly-Si layer |
| 66 | $SiO_2$ barrier layer |
| 67 | $SiN_x$ barrier layer |

TABLE 2

| Example No. | Treatment | Normalized H+ intensity | % reduction wrt implant |
|---|---|---|---|
| 11A | implanted | 414 | 0 |
| 11B | NH4OH + H2O2 & H2O2 + HCl | 102 | 75 |
| 11C | NH4OH + H2O2 | 101 | 76 |
| 11D | O2 plasma | 144 | 65 |

TABLE 3

| Glass/Si System | Voltage (V) | Process Temperature (° C.)[1] | Process Time (Minutes) | Bond energy (J/m$^2$) |
|---|---|---|---|---|
| 7070/Si | 1000 | 450 | 30 | >15 |
| 7740/Si | 500 | 450 | 15 | >15 |
| 1737/Si | 1750 | 575 | 15 | >15 |
| EAGLE 2000 ™/Si | 1750 | 575 | 10 | >15 |

[1]Glass temperature; silicon wafer temperature was 50° C. cooler.

TABLE 4

| Glass Temperature (° C.) | Voltage (V) | Process Time (Minutes) | Barrier Layer Thickness (Microns) | Pile-Up Ions |
|---|---|---|---|---|
| 350 | 1750 | 20 | No barrier layer | No pile-up |
| 575 | 1200 | 20 | 0.08 | Mg, Sr |
| 575 | 800 | 20 | 0.046 | Mg, Sr |
| 575 | 1750 | 20 | 0.1 | Mg, Sr |
| 595 | 1750 | 10 | 0.08 | Mg, Sr |
| 575 | 1750 | 10 | 0.096 | Mg, Sr |
| 575 | 1750 | 5 | 0.064 | Mg, Sr |
| 575 | 1750 | 2 | No barrier layer | No pile-up |
| 595 | 1750 | 2 | No barrier layer | No pile-up |

TABLE 5

| Prior Art | Present Invention |
|---|---|
| 1) Starting material - uncoated display glass | Starting material - silicon-on-glass |
| 2) Deposition of $SiN_x$ barrier layers by PECVD | Unnecessary |
| 3) Deposition of $SiO_2$ barrier layer by PECVD | Unnecessary |
| 4) Deposition of amorphous silicon layer. | Unnecessary |
| 5) Heat treatment to dehydrogenate the amorphous silicon layer | Unnecessary |
| 6) Laser (ELA) crystallization of silicon layer | Unnecessary |
| 7) Photolithography and dry etch of Si | Photolithography and dry etch of Si |
| 8) Deposition of gate oxide by PECVD | Deposition of gate oxide by PECVD |
| 9) Deposition of gate metal by sputtering | Deposition of gate metal by sputtering |
| 10) Photolithography and dry etch of gate | Photolithography and dry etch of gate |
| 11) Ion implantation and dopant activation | Ion implantation and dopant activation |
| 12) Deposition of encapsulation oxide by PECVD | Deposition of encapsulation oxide by PECVD |
| 13) Photolithography and dry etch of contact vias | Photolithography and dry etch of contact vias |
| 14) Deposition of contact metal by sputtering | Deposition of contact metal by sputtering |
| 15) Photolithography and dry etch of contacts | Photolithography and dry etch of contacts |
| 16) Rehydrogenate poly-Si layer | Unnecessary |

The invention claimed is:

1. A method of forming a semiconductor on glass structure, comprising:

establishing an exfoliation layer on a semiconductor wafer;

contacting the exfoliation layer of the semiconductor wafer to a glass substrate;

applying pressure, temperature and voltage to the semiconductor wafer and the glass substrate, without a vacuum atmosphere, such that a bond is established therebetween via electrolysis; and applying stress such that: (i) the exfoliation layer separates from the semiconductor wafer and remains bonded to the glass substrate; (ii) the exfoliation layer includes a layer of enhanced oxygen content; and (iii) the glass substrate includes a first substrate layer adjacent the layer of enhanced oxygen content and having a reduced positive ion concentration in which substantially no modifier positive ions are present, and a second substrate layer adjacent the first substrate layer and having an enhanced positive ion concentration of modifier positive ions, including at least one alkaline earth modifier ion.

2. The method of claim 1, wherein the bonding step is carried out in ambient air.

3. The method of claim 1, wherein the bonding step is carried out in a substantially inert gas atmosphere.

4. The method of claim 3, wherein the inert gas is nitrogen.

5. The method of claim 3, wherein the inert gas is argon.

6. The method of claim 3, wherein the inert gas is selected from the group consisting of helium, neon, krypton, xenon and radon.

7. The method of claim 1, wherein the step of establishing the exfoliation layer on the semiconductor wafer includes producing a region of imperfections in a crystal structure of the semiconductor wafer below a contact surface thereof.

8. The method of claim 7, wherein the step of producing a region of imperfections includes using ion implantation to create imperfections between the semiconductor wafer and the exfoliation layer.

9. The method of claim 1, wherein the step of applying temperature to the semiconductor wafer and the glass substrate includes directly or indirectly contacting at least one heated platen to at least one of the semiconductor wafer and the glass substrate.

10. The method of claim 9, further comprising:
directly or indirectly contacting at least one heated platen to the semiconductor wafer such that a first temperature is achieved; and
directly or indirectly contacting at least one heated platen to the glass substrate such that a second temperature is achieved.

11. The method of claim 10, wherein the first temperature is below the second temperature.

12. The method of claim 9, wherein the temperature of the glass substrate and the semiconductor wafer are elevated to within about +/−300 degrees C. of the strain point of the glass substrate.

13. The method of claim 1, wherein the semiconductor wafer is taken from the group consisting of: silicon (Si), germanium-doped silicon (SiGe), silicon carbide (SiC), germanium (Ge), gallium arsenide (GaAs), GaP, and InP.

14. A method of forming a semiconductor on glass structure, comprising:
establishing an exfoliation layer on a semiconductor wafer;
contacting the exfoliation layer of the semiconductor wafer to a glass substrate; directly or indirectly contacting at least one heated platen to at least one of the semiconductor wafer and the glass substrate to elevate the temperatures thereof;
applying pressure and voltage to the semiconductor wafer and the glass substrate such that a bond is established therebetween via electrolysis; and
applying stress such that: (i) the exfoliation layer separates from the semiconductor wafer and remains bonded to the glass substrate; (ii) the exfoliation layer includes a layer of enhanced oxygen content; and (iii) the glass substrate includes a first substrate layer adjacent the layer of enhanced oxygen content and having a reduced positive ion concentration in which substantially no modifier positive ions are present, and a second substrate layer adjacent the first substrate layer and having an enhanced positive ion concentration of modifier positive ions, including at least one alkaline earth modifier ion.

15. The method of claim 14, further comprising:
directly or indirectly contacting at least one heated platen to the semiconductor wafer such that a first temperature is achieved; and
directly or indirectly contacting at least one heated platen to the glass substrate such that a second temperature is achieved.

16. The method of claim 15, wherein the first temperature is below the second temperature.

17. The method of claim 14, wherein the stress is induced by cooling the bonded glass substrate, exfoliation layer, and semiconductor wafer such that a fracture occurs substantially at a junction of the exfoliation layer and the semiconductor wafer.

18. The method of claim 14, wherein the semiconductor wafer is taken from the group consisting of: silicon (Si), germanium-doped silicon (SiGe), silicon carbide (SiC), germanium (Ge), gallium arsenide (GaAs), GaP, and InP.

* * * * *